United States Patent
Ouyang

(10) Patent No.: US 12,230,862 B2
(45) Date of Patent: Feb. 18, 2025

(54) ANTENNA

(71) Applicant: FUJIFILM Corporation, Tokyo (JP)

(72) Inventor: Tianhua Ouyang, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 93 days.

(21) Appl. No.: 18/054,309

(22) Filed: Nov. 10, 2022

(65) Prior Publication Data

US 2023/0089629 A1     Mar. 23, 2023

Related U.S. Application Data

(63) Continuation of application No. PCT/JP2021/015567, filed on Apr. 15, 2021.

(30) Foreign Application Priority Data

May 13, 2020    (JP) .................................. 2020-084819

(51) Int. Cl.
*H01Q 1/12* (2006.01)
*H01Q 1/24* (2006.01)
(Continued)

(52) U.S. Cl.
CPC ........... *H01Q 1/1271* (2013.01); *H01Q 1/243* (2013.01); *H01Q 1/48* (2013.01); *H01Q 9/0407* (2013.01)

(58) Field of Classification Search
CPC ........ H01Q 1/1271; H01Q 1/243; H01Q 1/48; H01Q 9/0407; H01Q 1/44; H01Q 5/42;
(Continued)

(56) References Cited

U.S. PATENT DOCUMENTS

| 4,806,941 A | 2/1989 | Knochel et al. |
| 8,692,130 B2 * | 4/2014 | Okumura ............... H01Q 1/243 455/575.8 |

(Continued)

FOREIGN PATENT DOCUMENTS

| CN | 102282288 A | 12/2011 | |
| CN | 103680758 A * | 3/2014 | ............. G06F 3/041 |

(Continued)

OTHER PUBLICATIONS

Office Action, issued by the Japanese Patent Office on Oct. 10, 2023, in connection with Japanese Patent Application No. 2022-521776.
(Continued)

*Primary Examiner* — Hai V Tran
*Assistant Examiner* — Jordan E. DeWitt
(74) *Attorney, Agent, or Firm* — Edwards Neils LLC; Jean C. Edwards, Esq.

(57) ABSTRACT

Provided is an antenna where low transmission loss and visibility are simultaneously achieved. The antenna includes: a transparent film substrate; an antenna element that is provided on one surface among two surfaces of the transparent film substrate; and a ground part that is provided on the other surface among the two surfaces of the transparent film substrate. The antenna element and the ground part are formed of a mesh pattern formed of a fine silver wire, and a line width of the fine wire is 1.0 μm or more and less than 5.0 μm. A thickness of the transparent film substrate is 30 μm or more and 300 μm or less.

7 Claims, 11 Drawing Sheets

(51) Int. Cl.
*H01Q 1/48* (2006.01)
*H01Q 9/04* (2006.01)

(58) Field of Classification Search
CPC ........ H01Q 21/08; H01Q 21/24; H01Q 1/364; H05K 1/02
See application file for complete search history.

(56) References Cited

U.S. PATENT DOCUMENTS

| | | | |
|---|---|---|---|
| 10,394,398 B2* | 8/2019 | Hondo | H01B 5/14 |
| 2009/0051620 A1* | 2/2009 | Ishibashi | H01Q 9/16 |
| | | | 343/897 |
| 2009/0140938 A1* | 6/2009 | Ishibashi | H01Q 1/44 |
| | | | 343/897 |
| 2011/0273356 A1 | 11/2011 | Kawaguchi et al. | |
| 2014/0106684 A1* | 4/2014 | Burns | H01Q 21/28 |
| | | | 29/601 |
| 2014/0220259 A1* | 8/2014 | Wang | C09D 5/24 |
| | | | 427/126.1 |
| 2016/0190678 A1* | 6/2016 | Hong | H01Q 1/364 |
| | | | 343/700 MS |
| 2016/0293288 A1* | 10/2016 | Hu | C23C 18/44 |
| 2017/0083153 A1* | 3/2017 | Yeh | G06F 3/0418 |
| 2017/0139520 A1* | 5/2017 | Yeh | H01Q 9/30 |
| 2017/0352959 A1* | 12/2017 | Sugita | H01Q 1/2266 |
| 2017/0373397 A1* | 12/2017 | Yashiro | H01Q 1/243 |
| 2018/0046283 A1* | 2/2018 | Yoshida | G06F 3/0446 |
| 2020/0251813 A1 | 8/2020 | Ryu et al. | |
| 2020/0403301 A1 | 12/2020 | Ryu et al. | |
| 2021/0155818 A1 | 5/2021 | Tsuruta et al. | |
| 2023/0089629 A1* | 3/2023 | Ouyang | H01Q 1/243 |
| | | | 343/720 |

FOREIGN PATENT DOCUMENTS

| | | | |
|---|---|---|---|
| CN | 110933948 A | 3/2020 | |
| FR | 2668677 A1 * | 4/1992 | .......... H05K 9/0039 |
| JP | 62-274802 A | 11/1987 | |
| JP | 1-260712 A | 10/1989 | |
| JP | 2006-303846 A | 11/2006 | |
| JP | 2011-066692 A | 3/2011 | |
| JP | 2016-219999 A | 12/2016 | |
| WO | 2019/107514 A1 | 6/2019 | |
| WO | 2019/172609 A1 | 9/2019 | |
| WO | 2020/080704 A1 | 4/2020 | |

OTHER PUBLICATIONS

International Search Report issued in PCT/JP2021/015567 on Jun. 29, 2021.
Written Opinion issued in PCT/JP2021/015567 on Jun. 29, 2021.
International Preliminary Report on Patentability completed by WIPO on Nov. 15, 2022 in connection with International Patent Application No. PCT/JP2021/015567.
Office Action, issued by the State Intellectual Property Office of China on Apr. 30, 2024, in connection with Chinese Patent Application No. 202180034589.5.
Office Action, issued by the State Intellectual Property Office of China on Oct. 31, 2024, in connection with Chinese Patent Application No. 202180034589.5.

* cited by examiner

ANTENNA

CROSS-REFERENCE TO RELATED APPLICATIONS

This application is a Continuation of PCT International Application No. PCT/JP2021/015567 filed on Apr. 15, 2021, which was published under PCT Article 21 (2) in Japanese, and which claims priority under 35 U.S.C. § 119 (a) to Japanese Patent Application No. 2020-084819 filed on May 13, 2020. The above applications are hereby expressly incorporated by reference, in their entirety, into the present application.

BACKGROUND OF THE INVENTION

1. Field of the Invention

The present invention relates to an antenna including an antenna element that is formed of a fine silver wire and particularly relates to an antenna in which low transmission loss and visibility are simultaneously achieved.

2. Description of the Related Art

Currently, there are mobile communication terminals such as a mobile phone, a smartphone, or a tablet and various communication systems using wireless techniques such as the Internet communication, Wireless Fidelity (WiFi), Bluetooth (registered trade name), or Global Positioning System (GPS). In order to deal with various communication systems, an antenna capable of transmitting and receiving radio waves used in each of the communication systems is required.

In addition, for example, the fifth generation (5G) communication standard uses a frequency band of 3.7 to 6 GHz and 24 GHz or higher. The 5G uses radio waves having a higher frequency than before, and thus has advantageous effects of high speed, simultaneous multiple connections, and low delay. However, the 5G has characteristics in that the propagation distance of radio waves is shorter and the straightness is stronger as compared to the fourth generation (4G) communication standard in a frequency band of 450 MHz to 3.6 GHz that has been used until now. Due to these characteristics, many base stations are required, and a plurality of antennas need to be provided in a terminal.

A window of a building and a display unit of a mobile communication terminal function as a satisfactory opening portion of radio waves. Therefore, an inconspicuous and transparent antenna that can be provided in this opening portion is required.

For example, WO2019/107514A describes an antenna unit including a transparent substrate, one or more antenna conductors, and a transparent conductive film, in which the one or more antenna conductors are provided on a first main surface side of the transparent substrate, and the transparent conductive film is provided on a second main surface side of the transparent substrate opposite to the first main surface. In WO2019/107514A, the transparent substrate is formed of glass.

SUMMARY OF THE INVENTION

As described above, not only from the viewpoint of easy installation in a window of a building, a display unit of a mobile communication terminal, or the like but also from the viewpoint of preventing deterioration in the designability and the image quality of a scenery or a display, an antenna in which a reduction in thickness and size, flexibility, and high transparency are achieved is preferable. As a transparent substrate of an antenna, for example, glass or synthetic quartz described above in WO2019/107514A has been disclosed until now. From the viewpoint of a reduction in thickness and size, it is necessary to reduce the thickness of a glass substrate. However, in a case where it is desired to reduce the thickness of the glass or the other substrate, in order to perform impedance matching with a transmitter-receiver circuit of an antenna, it is necessary to reduce the width of an antenna pattern or a feeding line in many cases. In a case where a transparent conductive material such as indium tin oxide (ITO) is used, impedance matching with a transmitter-receiver circuit of an antenna can be achieved. However, the transparent conductive material has high electric resistance, and thus has high transmission loss. On the other hand, a mesh pattern formed of a fine metal wire has low electric resistance, and thus has low transmission loss. However, it is necessary to narrow an opening portion of the mesh pattern according to the width of the feeding line. In a case where the opening portion is narrow, the transmittance decreases, and the mesh pattern is conspicuous. This way, there is no antenna where low transmission loss and visibility are simultaneously achieved.

An object of the present invention is to provide an antenna where low transmission loss and visibility are simultaneously achieved.

According to one aspect of the present invention for achieving the above-described object, there is provided an antenna comprising: a transparent film substrate; an antenna element that is provided on one surface among two surfaces of the transparent film substrate; and a ground part that is provided on the other surface among the two surfaces of the transparent film substrate, in which the antenna element and the ground part are formed of a mesh pattern formed of a fine silver wire, a line width of the fine wire is 1.0 μm or more and less than 5.0 μm, and a thickness of the transparent film substrate is 30 μm or more and 300 μm or less.

It is preferable that the antenna further comprises: a feeding line that is provided on the one surface of the transparent film substrate, in which the feeding line is formed of the mesh pattern formed of the fine silver wire, and a line width of the fine wire is 1.0 μm or more and less than 5.0 μm.

It is preferable that the line width of the fine wire is 2.1 μm or more and 3.7 μm or less.

It is preferable that the fine silver wire includes a plurality of silver particles dispersed in a polymer, and it is preferable that a proportion of the plurality of silver particles in the fine silver wire is 70 vol % or more.

It is preferable that a thickness of the fine wire is 0.5 μm or more and less than 5.0 μm.

In a case where the transparent film substrate is observed from the one surface or the other surface, a surface roughness of the fine wire of the one surface or the other surface on an observation side is represented by Rq(A), and a surface roughness of the fine wire of the other surface or the one surface on a transparent film substrate side opposite to the observation side is represented by Rq(B), it is preferable that $0.05 \mu m \leq Rq(A) \leq 0.35 \mu m$ and $|Rq(B)-Rq(A)| \leq 0.25 \mu m$ are satisfied.

According to the aspects of the present invention, low transmission loss and visibility can be achieved.

DESCRIPTION OF THE PREFERRED EMBODIMENTS

Hereinafter, an antenna according to the present invention will be described in detail based on a preferred embodiment shown in the accompanying drawings.

The drawings described below are exemplary drawings for describing the present invention, and the present invention is not limited to the drawings described below.

In the following description, a numerical range indicated by the expression "to" includes numerical values described on both sides. For example, in a case where ε is a numerical value α to a numerical value β, the range ε is a range including the numerical value α and the numerical value β, which is expressed by a mathematical symbol α≤ε≤β.

Unless specified otherwise, the meaning of an angle such as "an angle represented by a specific numerical value", "parallel", "vertical", or "perpendicular" includes a case where an error range is generally allowable in the technical field.

In addition, the meaning of "entire surface" includes a case where an error range is generally allowable in the technical field.

In addition, light denotes an actinic ray or radiation. In the present specification, unless specified otherwise, "exposure" denotes not only exposure using a mercury lamp, a far ultraviolet ray represented by excimer laser, an X-ray, an EUV ray, or the like but also drawing using a particle beam such as an electron beam or an ion beam.

In this specification, "(meth)acrylate" denotes either or both of acrylate and methacrylate, and "(meth)acryl" denotes either or both of acryl and methacryl.

Unless specified otherwise, "transparent" represents being transparent with respect to visible light. Unless specified otherwise, "transparent" represents that a light transmittance in a visible wavelength range of 380 to 780 nm is 92% or more.

The light transmittance is measured using "Plastics—Determination of Total Luminous Transmittance And Reflectance" defined by Japanese Industrial Standards (JIS) K 7375:2008.

(Antenna)

The antenna comprises: a transparent film substrate; an antenna element that is provided on one surface among two surfaces of the transparent film substrate; and a ground part that is provided on the other surface among the two surfaces of the transparent film substrate. The antenna element and the ground part are formed of a mesh pattern formed of a fine silver wire. In addition, the antenna further comprises a feeding line that is provided on the one surface of the transparent film substrate, that is, the same surface as the antenna element. The feeding line is also formed of a mesh pattern formed of the fine silver wire.

Hereinafter, the antenna will be described in detail.

Figure 1:
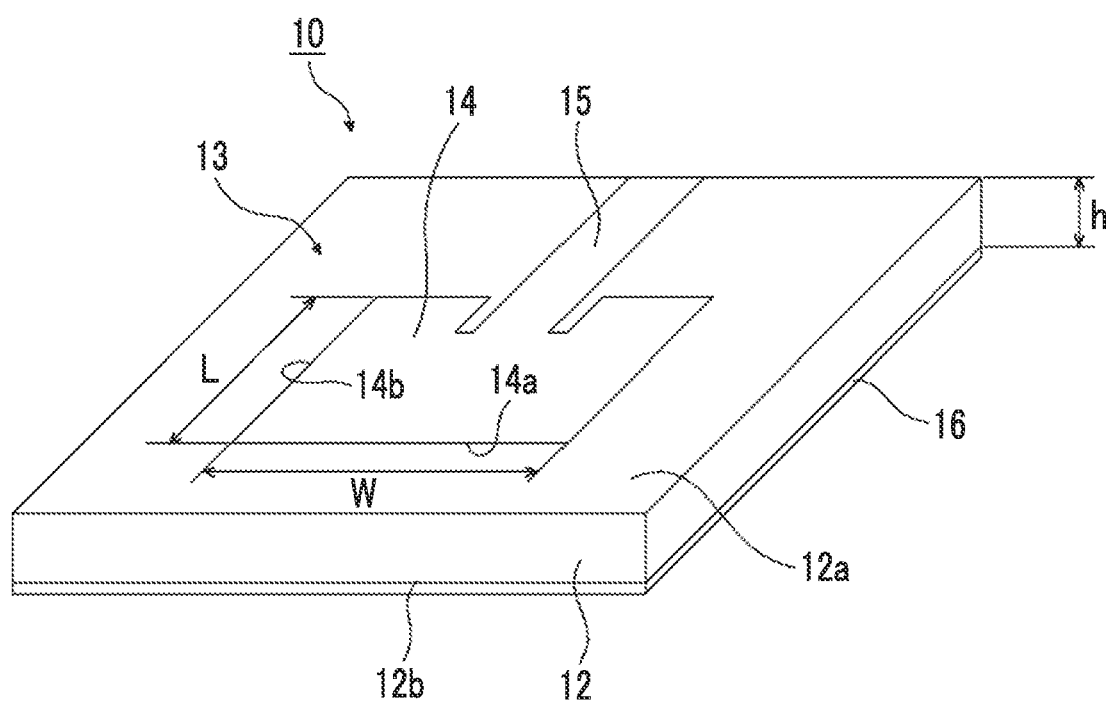
FIG. 1 is a schematic perspective view showing an example of an antenna according to an embodiment of the present invention.
Figure 2:
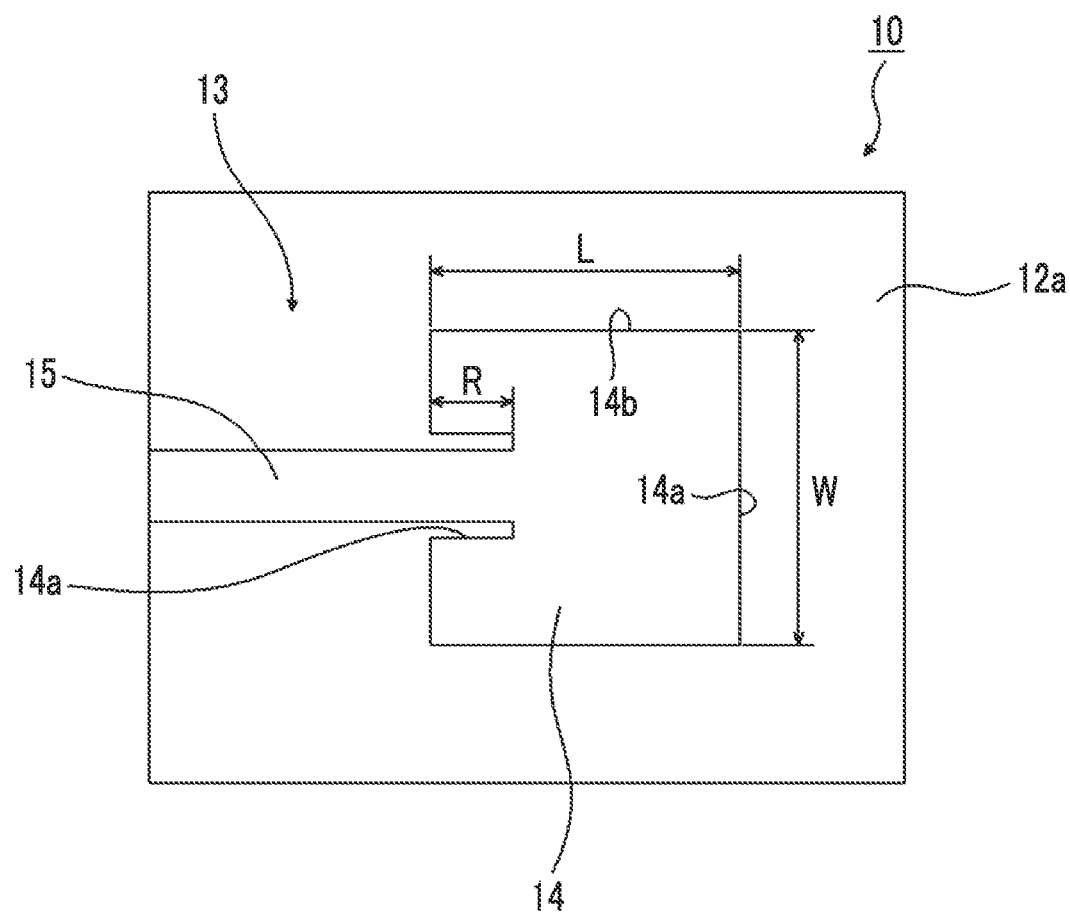
FIG. 2 is a schematic plan view showing the example of the antenna according to the embodiment of the present invention.
Figure 3:
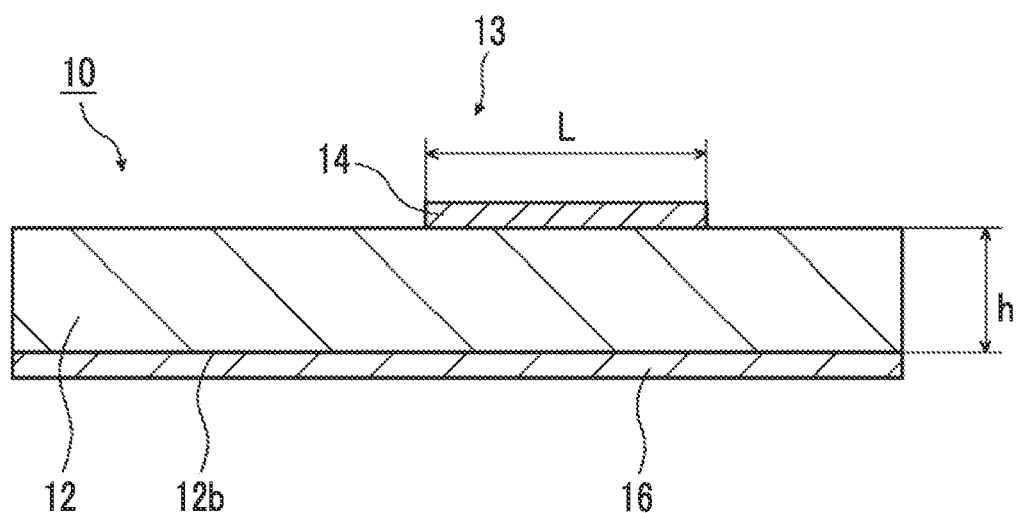
FIG. 3 is a schematic cross-sectional view showing the example of the antenna according to the embodiment of the present invention.

FIG. 1 is a schematic perspective view showing an example of the antenna according to the embodiment of the present invention. FIG. 2 is a schematic plan view showing the example of the antenna according to the embodiment of the present invention. FIG. 3 is a schematic cross-sectional view showing the example of the antenna according to the embodiment of the present invention. FIGS. 1 and 2 do not show the mesh pattern.

An antenna 10 shown in FIG. 1 includes: a transparent film substrate 12; and an antenna element 14 and a feeding line 15 that are provided on a front surface 12a of the transparent film substrate 12. The antenna 10 includes a ground part 16 that is provided on a back surface 12b of the transparent film substrate 12 facing the front surface 12a of the transparent film substrate 12. The antenna element 14 and the feeding line 15 form an antenna part 13. The antenna 10 is called a patch antenna, the antenna element 14 is also called a radiation element, and the feeding line 15 is also called a microstrip line.

In the antenna 10 shown in FIGS. 1 and 2, for example, the antenna element 14 has a quadrangular shape as an external shape and an inner angle of 90°. In the antenna element 14, a side 14a and a side 14b are perpendicular to each other. The side 14b extends in a direction parallel to a length direction of the feeding line 15.

It is assumed that the length of the side 14a is represented by W and the length of the side 14b is represented by L. The length W of the side 14a and the length L of the side 14b are appropriately set depending on characteristics such as a frequency at which the antenna 10 transmits and receives radio waves.

The feeding line 15 is inserted into the antenna element 14. It is assumed that the insertion amount of the feeding line 15 inserted into the antenna element 14 is represented by R. Impedance matching can be achieved depending on the insertion amount R.

As shown in FIG. 3, the ground part 16 is provided on the entire back surface 12b of the transparent film substrate 12. The ground part 16 functions as a ground plane. In addition, the ground part 16 also functions as a radio wave reflective layer, and the directivity of the antenna 10 is controlled by the ground part 16. The ground part 16 only needs to be larger than the antenna element 14 and does not need to be provided on the entire back surface 12b of the transparent film substrate 12.

The antenna 10 shown in FIG. 1 is a type in which power is fed to the antenna element 14 through the feeding line 15 disposed on the same surface as the antenna element 14.

In the antenna 10, a slit portion into which the feeding line 15 is inserted is provided from an end part of the antenna element 14 to an inner region thereof, and the feeding line 15 is electrically connected to a tip part of the slit portion. In the antenna 10, by adjusting the position of the tip part of the feeding line 15, that is, by adjusting the insertion amount R, the impedance can be matched.

An operating frequency of the antenna 10 shown in FIG. 1 is determined depending on the length L of the side 14b. In a case where a center frequency is represented by fc, the center frequency fc is obtained from the following Expression. In the following expression, c represents a light speed, $\varepsilon_r$ represents a relative permittivity of the transparent film substrate, $\varepsilon_0$ represents a dielectric constant of a vacuum, and $\mu_0$ represents a magnetic permeability of a vacuum. In addition, in a pattern design of the antenna, the length L may be slightly different from a resonant length depending on the shape of the pattern, the thickness of the substrate, the dielectric constant, and the like.

$$f_c = \frac{c}{2L\sqrt{\varepsilon_r}} = \frac{1}{2L\sqrt{\varepsilon_0 \varepsilon_r \mu_0}}$$

By changing the length W of the side 14a of the antenna element 14 of the antenna 10, the input impedance can change. In a case where the length W of the side 14a increases, the input impedance can decrease. The configuration of the antenna 10 shown in FIG. 1 corresponds to, for example, a frequency band of 28 GHz, in which as an antenna where the impedance is 50Ω, both the length W of the side 14a and the length L of the side 14b are 3 mm. In addition, the insertion amount R is 0.75 mm.

In the configuration of the antenna 10 shown in FIG. 1, the feeding line 15 is provided in the antenna element 14. However, the present invention is not limited to this configuration. The feeding line 15 does not need to be connected to the antenna element 14, and the feeding line 15 does not need to be provided on the front surface 12a of the transparent film substrate 12.

Figure 4:
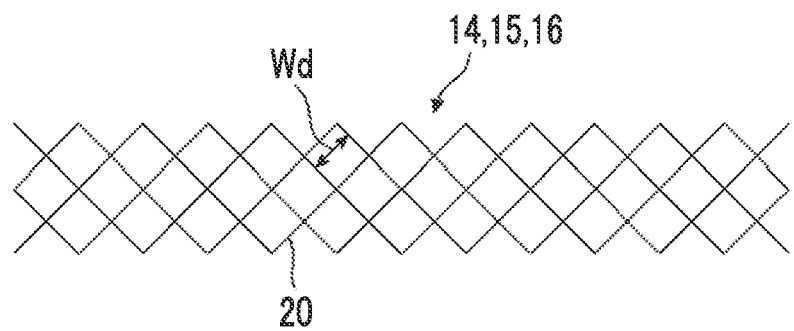
FIG. 4 is a schematic diagram showing an example of a mesh pattern of a fine silver wire forming the antenna according to the embodiment of the present invention.
Figure 5:
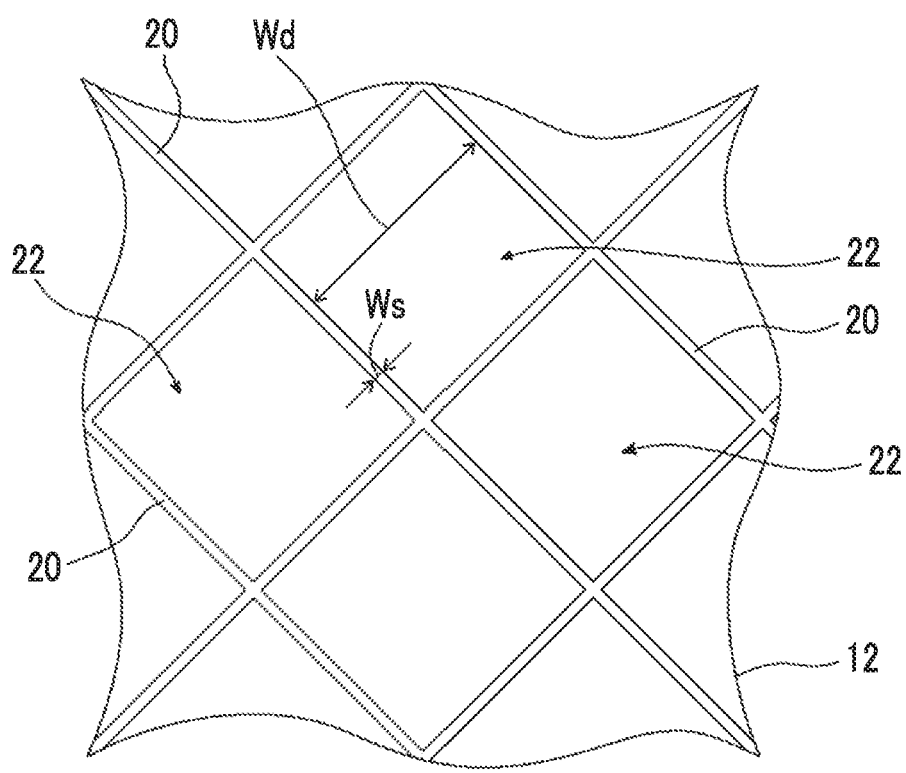
FIG. 5 is an enlarged view showing the example of the mesh pattern of the fine silver wire forming the antenna according to the embodiment of the present invention.

Here, FIG. 4 is a schematic diagram showing an example of a mesh pattern of a fine silver wire forming the antenna according to the embodiment of the present invention. FIG. 5 is an enlarged view showing the example of the mesh pattern of the fine silver wire forming the antenna according to the embodiment of the present invention.

In the antenna 10 shown in FIG. 1, as described above, the antenna element 14, the feeding line 15, and the ground part 16 are formed of a mesh pattern formed of a fine silver wire. In the mesh pattern, specifically, for example, as shown in FIGS. 4 and 5, a plurality of fine wires 20 have a plurality of opening portions 22 (lattices) having a rhombic shape that intersect with each other at 90°.

In the antenna 10, a line width Ws (refer to FIGS. 5 and 6) of the fine wire 20 is 1.0 μm or more and less than 5.0 μm and preferably 2.1 μm or more and 3.7 μm or less. The thickness t of the fine wire 20 is preferably 0.5 μm or more and less than 5.0 μm. The thickness h (refer to FIGS. 1 and 2) of the transparent film substrate 12 is 30 μm or more and 300 μm or less.

<Mesh Pattern>

As shown in FIGS. 4 and 5, the mesh pattern formed of the fine wires 20 has a shape including the plurality of opening portions 22 (lattices) having a rhombic shape that are formed of the fine wires 20 intersecting with each other. The opening portion 22 is a region surrounded by the fine wires 20 and is present in the mesh pattern. In FIGS. 4 and 5, the opening portion 22 has a rhombic shape but may have other shapes. The opening portion 22 is preferably a triangle such as a regular triangle, an isosceles triangle, or a right triangle, a quadrangle such as a square, a rectangle, a parallelogram, or a trapezoid, a regular n-polygon such as a (regular) hexagon or a (regular) octagon, or a geometric figure as a combination of a circle, an ellipse, a star shape, and the like. In addition, in the opening portion 22, the shape of one side may be a curved shape or may be an arc shape in addition to a linear shape. In a case where the shape of one side has an arc shape, for example, two sides facing each other may have an arc shape that is outwardly convex, and the other two sides facing each other may have an arc shape that is inwardly convex. In addition, the shape of each of the sides may have a wavy line shape in which an arc that is outwardly convex and an arc that is inwardly convex are continuous. Of course, the shape of each of the sides may be a sine curve shape.

<Fine Wire>

As described above, as described above, as long as where the fine wire 20 is formed of silver, the configuration thereof is not particularly limited.

The meaning of the configuration in which the fine wire 20 is formed of silver includes not only a configuration where the fine wire 20 is formed of metallic silver alone but also a case where the fine wire 20 includes silver and a polymer and a case where the fine wire 20 includes a plurality of silver particles dispersed in the polymer. In this case, for example, the fine wire 20 is formed using a manufacturing method using a silver halide. In a case where the fine wire 20 is formed of metallic silver alone, for example, the fine wire 20 is formed using a vapor deposition method or a sputtering method.

Figure 6:
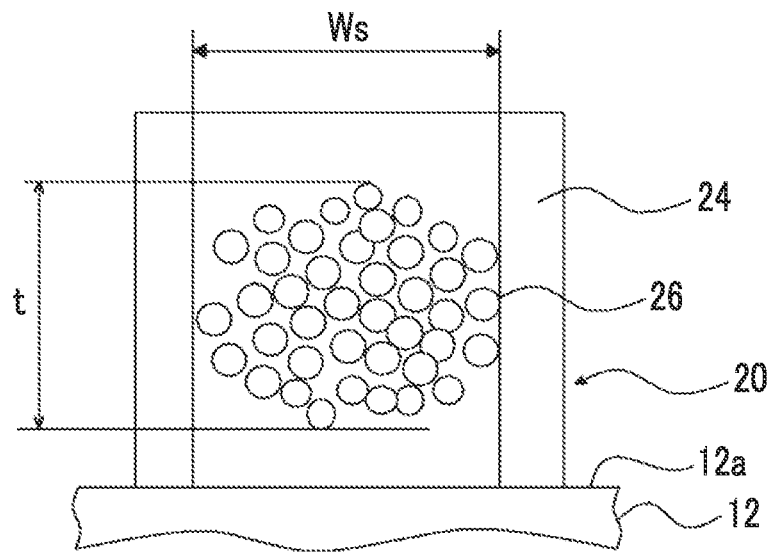
FIG. 6 is a schematic vertical cross-sectional view showing an example of the fine silver wire forming the antenna according to the embodiment of the present invention.

For example, as shown in FIG. 6, the fine wire 20 includes a polymer 24 and a plurality of silver particles 26. In the fine wire 20, the plurality of silver particles 26 are more likely to be dispersed in the polymer 24.

The kind of the polymer 24 is not particularly limited, and a well-known polymer can be used. In particular, as the polymer 24, a specific polymer described below is preferable. The specific polymer is a polymer other than gelatin, that is, a polymer different from gelatin. The details will be described below.

The silver particles 26 in the fine wire 20 is a portion that ensures the conductivity of the fine wire 20. The silver particles 26 may be discretely present in the polymer or may be cohesively present in the polymer. By forming the fine wire 20 using silver, the occurrence of disconnection of the fine wire decreases.

The silver particles 26 have a particle shape in FIG. 6. However, the shape of the silver particles 26 is not limited to a particle shape and may be, for example, a shape in which a part or all of the particles are fused and bonded to each other.

The proportion of the plurality of silver particles in the fine wire is preferably 70 vol % or more, and the upper limit thereof is 90 vol %. In a case where the proportion of the silver particles is 70 vol % or more, sufficient conductivity can be obtained, and high frequency transmission can be improved. The proportion of the silver particles can be obtained as described below.

The silver particles of the fine wire can be observed by observing a cross-section of the fine wire with a scanning electron microscope, and the shape and the like can be specified.

In the measuring method using the scanning electron microscope, first, carbon is vapor-deposited on the surface of the fine wire in order to impart conductivity to the surface of the fine wire. Next, by observing the surface shape with a scanning electron microscope (S-5200 SEM, manufactured by Hitachi High-Technologies Corporation), a region where the silver particles are present in the fine wire can be observed. Observation conditions are a secondary electron mode and an acceleration voltage of 10 kV.

In this case, in a case where the cross-section of the fine wire is observed, an acceleration voltage at which the polymer and the metal particles are contrasted with the scanning electron microscope is selected. More specifically, in the method of observing the cross-section of the fine wire, after cutting the cross-section of the fine wire with a microtome, carbon is vapor-deposited on the exposed cross-section to impart conductivity, and the cross-section is observed with a scanning electron microscope (S-5200 SEM, manufactured by Hitachi High-Technologies Corporation). Observation conditions are a reflective electron mode and an acceleration voltage of 5 kV.

By calculating the area of the silver particle portion and the total area of the fine wire from the observation image of the vertical section of the fine wire with the scanning electron microscope, the proportion (vol %) of the silver particles can be obtained.

[Opening Ratio]

A length Wd of one side of the opening portion 22 is not particularly limited and is preferably 1500 µm or less, more preferably 1300 µm or less, still more preferably 1000 µm or less, still more preferably 400 µm or less, and is preferably 5 µm or more, more preferably 30 µm or more, and still more preferably 80 µm or more. In a case where the length of one side of the opening portion is in the above-described range, the transparency can be ensured more satisfactorily. Even in a case where the antenna 10 is attached to a front surface of a display device, the display can be recognized without discomfort. In addition, even in a case where the antenna 10 is attached to glass or the like, there is no discomfort.

From the viewpoint of visible light transmittance, the opening ratio of the mesh pattern is preferably 75% or more, more preferably 80% or more, still more preferably 85% or more, still more preferably 90% or more, and most preferably 95% or more. As the opening ratio of the mesh pattern increases, the antenna is more inconspicuous.

The opening ratio refers to a proportion of a region on the transparent film substrate 12 excluding a region where the fine wire 20 is provided in the mesh pattern region. That is, the opening ratio refers to a proportion of the opening portions 22 in the mesh pattern on the front surface 12a of the transparent film substrate 12.

The opening ratio can be measured as follows. First, in the antenna part, the total light transmittance of the transparent film substrate after the formation of the mesh pattern is measured. Next, for the antenna, the total light transmittance of the transparent film substrate after the formation of the mesh pattern is measured in five regions. The five regions of the transparent film substrate may have the same size or different sizes as long as the acquisition positions in the transparent film substrate are different from each other. Next, the opening ratio is acquired using the following expression. The average value of the acquired five opening ratios is the opening ratio.

Opening Ratio=((Total Light Transmittance of Transparent Film Substrate after Formation of Mesh Pattern)/(Total Light Transmittance of Transparent Film Substrate before Formation of Mesh Pattern))×100(%)

[Line Width of Fine Wire and Thickness of Fine Wire]

In the antenna, the line width Ws (refer to FIG. 6) of the fine wire is defined as a range where the plurality of silver particles 26 (refer to FIG. 6) are present. From the viewpoint of simultaneously achieving conductivity and inconspicuousness, the line width Ws of the fine wire is 1.0 µm or more and less than 5.0 µm. From the viewpoint of the inconspicuousness of the fine wire, the line width Ws is preferably 2.1 µm or more and 3.7 µm or less. In a case where the line width Ws (refer to FIG. 6) of the fine wire is less than 1.0 µm, the fine wire is inconspicuous. However, the conductivity decreases, and the transmission loss increases. On the other hand, the line width Ws (refer to FIG. 6) of the fine wire is 5.0 µm or more, the conductivity is ensured, and the transmission loss is sufficiently low. However, the fine wire is conspicuous.

In the antenna, the thickness t (refer to FIG. 6) of the fine wire is defined as a range where the plurality of silver particles 26 (refer to FIG. 6) are present. The thickness t of the fine wire is not particularly limited and, from the viewpoints of the conductivity and the flexibility of the fine wire, is preferably 0.5 µm or more and less than 5.0 µm, more preferably 0.5 to 3.0 µm, and still more preferably 1.0 to 2.0 µm.

The line width Ws of the fine wire 20 is measured as described above by cutting the cross-section of the fine wire with a microtome, vapor-depositing carbon on the exposed cross-section, and observing the cross-section with a scanning electron microscope. The line width Ws of the fine wire 20 refers to an arithmetic mean value corresponding to line widths obtained by selecting any five positions of one fine wire, observing vertical sections thereof with a scanning electron microscope, and obtaining the line widths from the images.

In addition, as in the line width Ws, the thickness t of the fine wire refers to an arithmetic mean value of a portion corresponding to the thicknesses of five positions of one fine wire.

[Surface Roughness]

In order to suppress reflective visibility, a method of forming the surface of the fine wire in an uneven shape to suppress a light reflectivity can be adopted. In this method, it is not necessary to form a blackening layer in the fine wire, and thus the manufacturing method is simple. However, in a high frequency that is used in the 5G communication, in particular, in millimeter waves, a smooth conductor for the skin effect is preferable, and the optimum surface roughness is present. On the other hand, in a case where the fine wire is present on both surfaces of the transparent film substrate, as a difference in reflectivity between the fine wire close to an observation direction and the fine wire far from the observation direction increases, the fine wire is conspicuous. Therefore, a difference between the surface roughness of the fine wire close to the observation direction and the surface roughness of the fine wire far from the observation direction is defined.

In a case where the transparent film substrate 12 is observed from the one surface or the other surface, a surface roughness of the fine wire of the one surface or the other surface on the observation side is represented by Rq(A), and a surface roughness of the fine wire of the other surface or the one surface on the transparent film substrate side opposite to the observation side is represented by Rq(B), it is preferable that 0.05 μm≤Rq(A)≤0.35 μm and |Rq(B)−Rq(A)|≤0.25 μm are satisfied.

Both of the surface roughness Rq(A) and the surface roughness Rq(B) are root-mean-square roughness values measured according to JIS B0601:2013.

Regarding the surface roughness Rq(A), a cross-section (refer to FIG. 7) of the fine wire in the length direction is cut into a length of about 20 μm with a microtome, and carbon is vapor-deposited on the exposed cross-section of the fine wire to impart conductivity. The cross-sectional image is acquired using a scanning electron microscope. Using the image processing software Image J, the acquired cross-sectional image is analyzed to obtain the surface roughness. The measurement range is set as 20 μm, cross-sectional images of any five positions of the fine wire are acquired to obtain surface roughness values thereof, and an arithmetic mean value corresponding to the surface roughness values of the five positions is obtained as the surface roughness Rq(A). In a case where the fine wire 20 is observed from a surface 20a, the surface roughness Rq(A) is the surface roughness of the surface 20a of the fine wire 20 which is the roughness of the surface formed of the plurality of silver particles 26 shown in FIG. 7.

Regarding the surface roughness Rq(B), as in the above-described surface roughness Rq(A), a cross-section of the fine wire in the length direction is cut into a length of about 20 μm with a microtome, and carbon is vapor-deposited on the exposed cross-section of the fine wire to impart conductivity. The cross-sectional image is acquired using a scanning electron microscope. Using the image processing software Image J, the acquired cross-sectional image is analyzed to obtain the surface roughness. The measurement range is set as 20 μm, cross-sectional images of any five positions of the fine wire are acquired to obtain surface roughness values thereof, and an arithmetic mean value corresponding to the surface roughness values of the five positions is obtained as the surface roughness Rq(B). In a case where the fine wire 20 is observed from the surface 20a, the surface roughness Rq(B) is the surface roughness of a surface 20d of the fine wire 20 which is the roughness of the surface formed of the plurality of silver particles 26 shown in FIG. 7.

Figure 7:
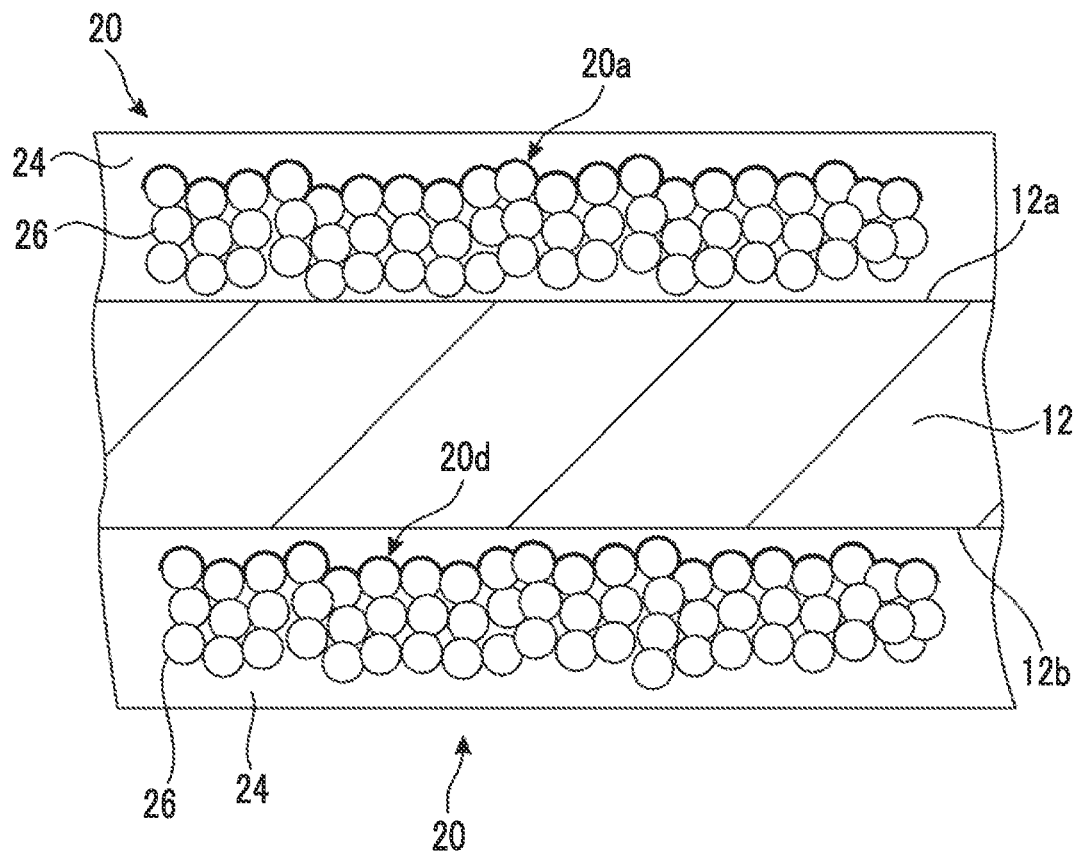
FIG. 7 is a schematic vertical cross-sectional view showing the example of the fine silver wire forming the antenna according to the embodiment of the present invention.
Figure 8:
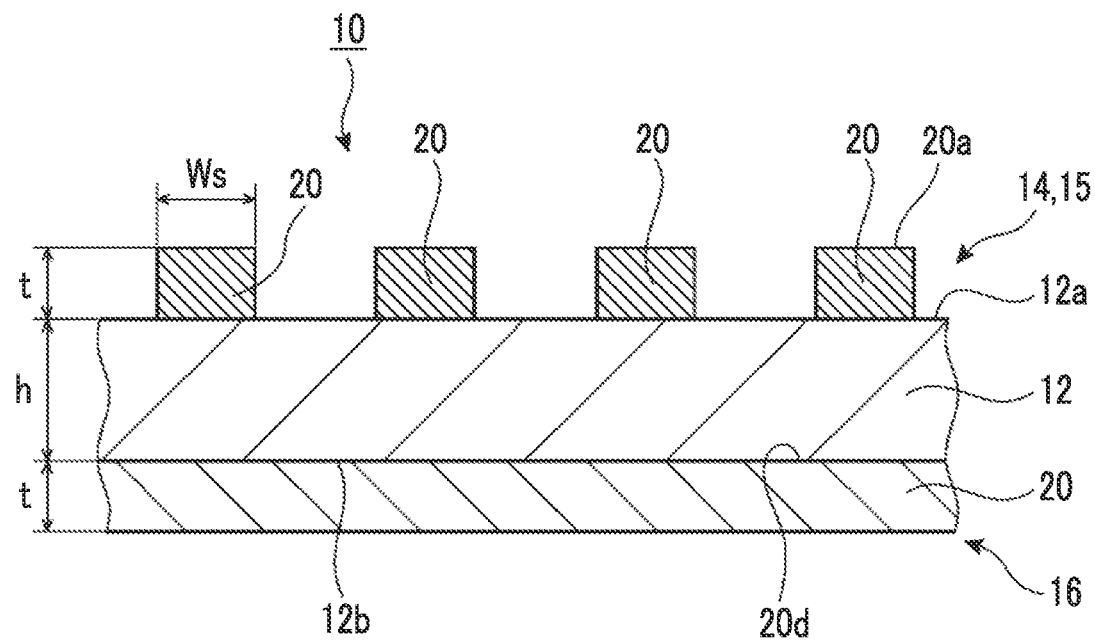
FIG. 8 is a schematic cross-sectional view showing an example of an arrangement of the fine silver wires forming the antenna according to the embodiment of the present invention.

Specifically, as shown in FIG. 8, in the antenna 10, the fine wires 20 forming the antenna element 14 and the feeding line 15 are provided on the front surface 12a of the transparent film substrate 12. The fine wires 20 forming the ground part 16 are provided on the back surface 12b of the transparent film substrate 12. For example, in a case where the antenna 10 is observed from the front surface 12a side of the transparent film substrate 12, the surface roughness of the surface 20a of the fine wire 20 forming the antenna element 14 and the feeding line 15, that is, the roughness of the surface formed of the plurality of silver particles 26 shown in FIG. 7 is Rq(A). The surface roughness of the surface 20d of the fine wire 20 forming the ground part 16 is Rq(B). This way, the surface roughness of the surface 20d of the fine wire 20 forming the ground part 16, that is, the roughness of the surface formed of the plurality of silver particles 26 shown in FIG. 7 is the surface roughness Rq(B) of the surface of the fine wire on the transparent film substrate side opposite to the observation side.

The surface roughness Rq(A) and the surface roughness Rq(B) satisfy 0.05 μm≤Rq(A)≤0.35 μm and |Rq(B)−Rq(A)|≤0.25 μm as described above such that the reflection of the fine wires is small and the fine wires are inconspicuous.

The surface roughness Rq(A) and the surface roughness Rq(B) are adjusted by a calendar treatment.

(Antenna Array)

The antenna 10 shown in FIG. 1 can be formed of an antenna alone or can also adopt a configuration in which a plurality of antennas are disposed.

Figure 9:
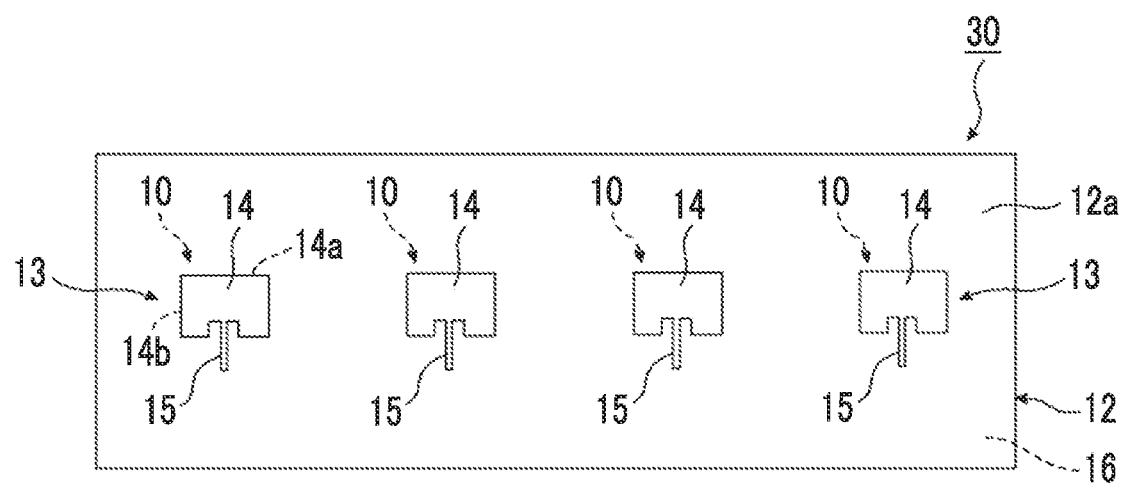
FIG. 9 is a schematic diagram showing a first example of an antenna array including the antenna according to the embodiment of the present invention.
Figure 10:
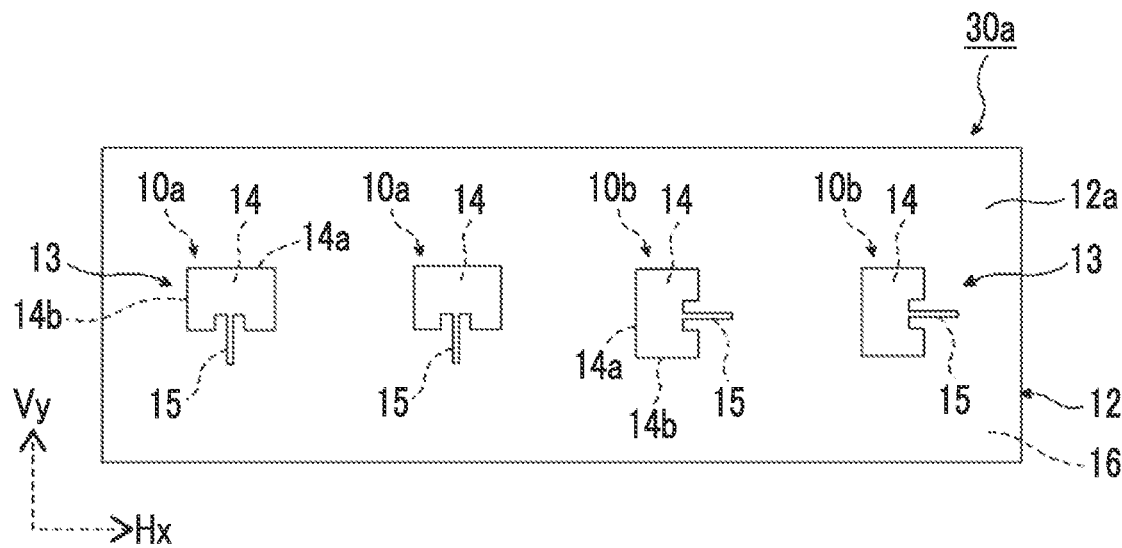
FIG. 10 is a schematic diagram showing a second example of the antenna array including the antenna according to the embodiment of the present invention.
Figure 11:
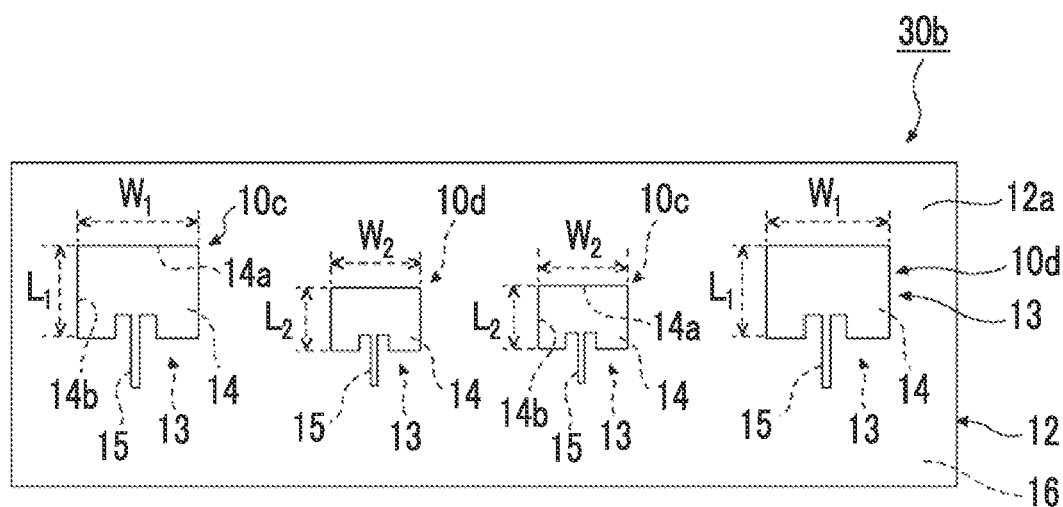
FIG. 11 is a schematic diagram showing a third example of the antenna array including the antenna according to the embodiment of the present invention.
Figure 12:
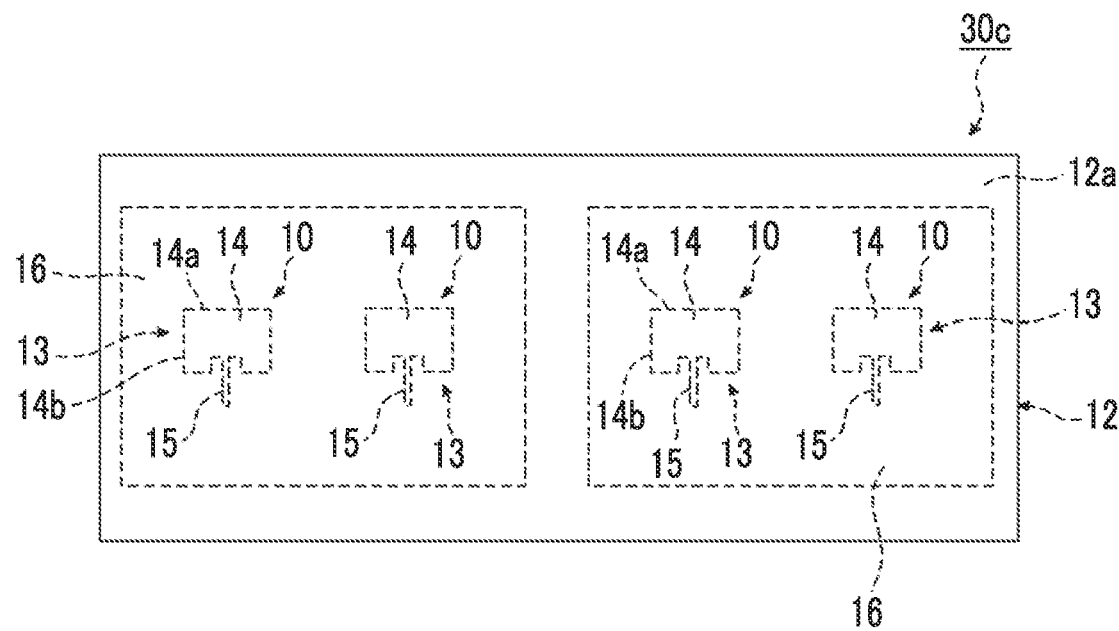
FIG. 12 is a schematic diagram showing an example of an arrangement of a plurality of antennas according to the embodiment of the present invention.

FIG. 9 is a schematic diagram showing a first example of an antenna array including the antenna according to the embodiment of the present invention. FIG. 10 is a schematic diagram showing a second example of the antenna array including the antenna according to the embodiment of the present invention. FIG. 11 is a schematic diagram showing a third example of the antenna array including the antenna according to the embodiment of the present invention. FIG. 12 is a schematic diagram showing an example of an arrangement of a plurality of antennas according to the embodiment of the present invention. In FIGS. 9 to 12, the same structures as the antenna 10 shown in FIG. 1 are represented by the same reference numeral, and the detailed description will not be repeated. FIGS. 9 to 12 do not show the mesh pattern.

In an antenna array 30 shown in FIG. 9, for example, four antennas 10 are disposed such that the directions of the feeding lines 15 are aligned. The four antennas 10 have the same size and are disposed at regular intervals in one direction. The antenna array 30 shown in FIG. 9 is also called a linear array antenna.

In the antenna array 30, all of the antennas 10 or some of the antennas 10 are excited such that an amplitude of an excitation current or an amplitude of an excitation voltage and a phase of an excitation current or a phase of an excitation voltage are controlled. As a result, radiation directivity and the like can be changed.

In an antenna array 30a shown in FIG. 10, for example, two antennas 10a and two antennas 10b are disposed such that the directions of the feeding lines 15 are different by 90°. The two antennas 10a are disposed such that the sides 14b are matched in a Vy direction. The two antennas 10b are disposed such that the sides 14b are matched in a Hx direction. The Vy direction and the Hx direction are perpendicular to each other.

The antennas 10a transmit and receive, for example, vertically polarized waves. The antennas 10b transmit and receive, for example, horizontally polarized waves in the H direction. In the antenna array 30a, by disposing the two antennas 10a and 10b having different polarization directions, radio waves can be stably transmitted and received in all of the directions. The antennas 10a and 10b shown in FIG. 10 have the same configuration as the antenna 10 shown in FIG. 1.

In an antenna array 30b of FIG. 11, antennas 10c and 10d having different sizes are linearly disposed. In the antenna 10c, the length of the side 14a is $W_1$, and the length of the side 14b is $L_1$. In the antenna 10d, the length of the side 14a is $W_2$, and the length of the side 14b is $L_2$. The length $W_1$ of the side 14a of the antenna 10c>the length $W_2$ of the side 14a of the antenna 10d is satisfied. The length $L_1$ of the side 14b of the antenna 10c>the length $L_2$ of the side 14b of the antenna 10d is satisfied.

As described above, the operating frequency of the antenna, that is, the center frequency fc is determined depending on the length of the side 14b. It can be seen from the above-described expression that as the length of the side 14b of the antenna 10 increases, the center frequency fc decreases. As in the antenna array 30b shown in FIG. 11, by disposing the antennas where the lengths of the sides 14b are different, a plurality of frequencies can be transmitted and received. The length $W_1$ of the side 14a of the antenna 10c and the length $W_2$ of the side 14a of the antenna 10d are determined depending on the input impedances.

The antennas 10c and 10d shown in FIG. 11 have the same configuration as the antenna 10 shown in FIG. 1 except that the lengths of the sides are different.

In addition, as in an antenna array 30c shown in FIG. 12, a plurality of antennas 10 can also be configured such that the antenna part 13 is provided on the front surface 12a of the transparent film substrate 12 and the antenna part 13 is provided on the back surface 12b of the transparent film substrate 12. As a result, radio waves can be transmitted to and received from the front surface 12a of the transparent film substrate 12, and radio waves can be further transmitted to and received from the back surface 12b of the transparent film substrate 12. Therefore, for example, by providing the transparent film substrate 12 in a window of a building, a wall that separates rooms, or the like, communication between the outside and the building or communication between the rooms can be performed.

In the antenna arrays 30, 30a, 30b, and 30c, the antennas are not limited to the linear arrangement and may be disposed in a planar shape. In this case, for example, the antennas 10 are disposed in two directions perpendicular to each other.

In the above-described antenna arrays 30, 30a, 30b, and 30c, the antenna part 13 and the ground part 16 of the antenna 10 are formed of the mesh pattern of the fine silver wire such that a plurality of antennas 10 can be simultaneously formed on the transparent film substrate 12. Further, by using the roll-to-roll process, the antenna arrays 30, 30a, 30b, and 30c can be continuously manufactured.

Other Examples of Antenna

Figure 13:
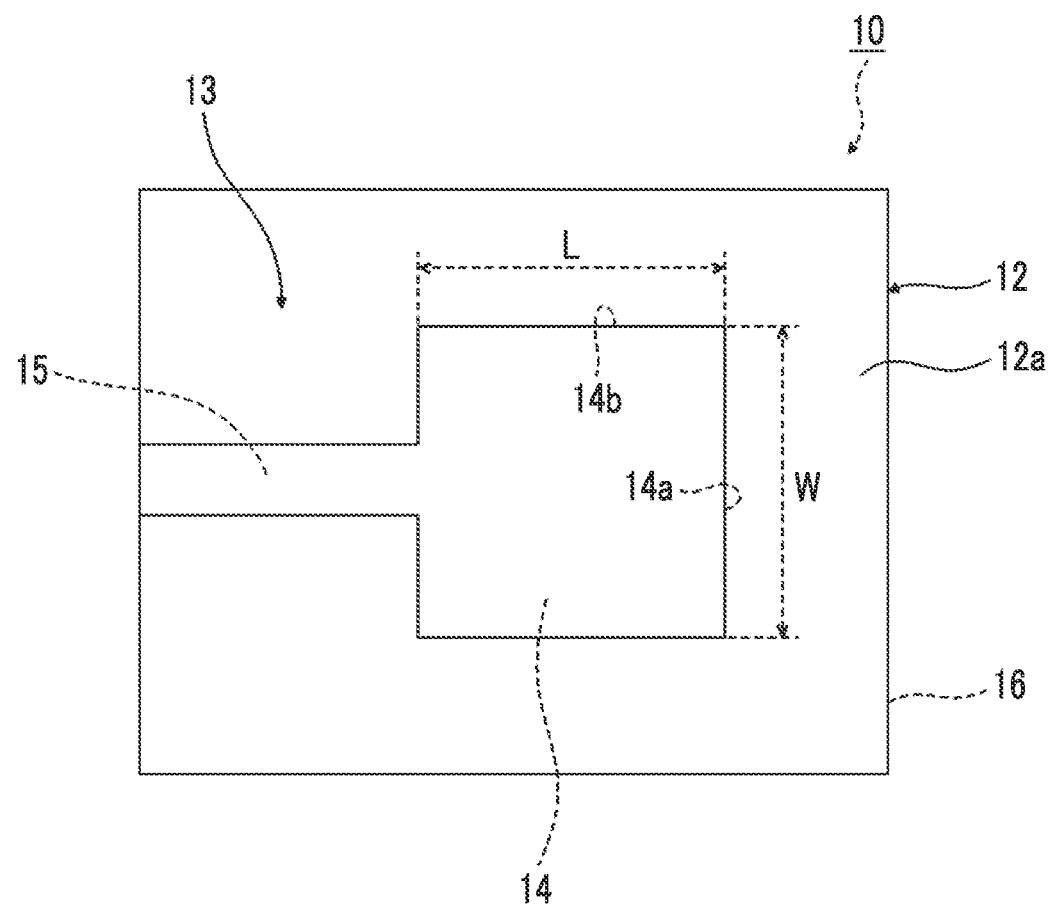
FIG. 13 is a schematic plan view showing another example of the antenna according to the embodiment of the present invention.
Figure 14:
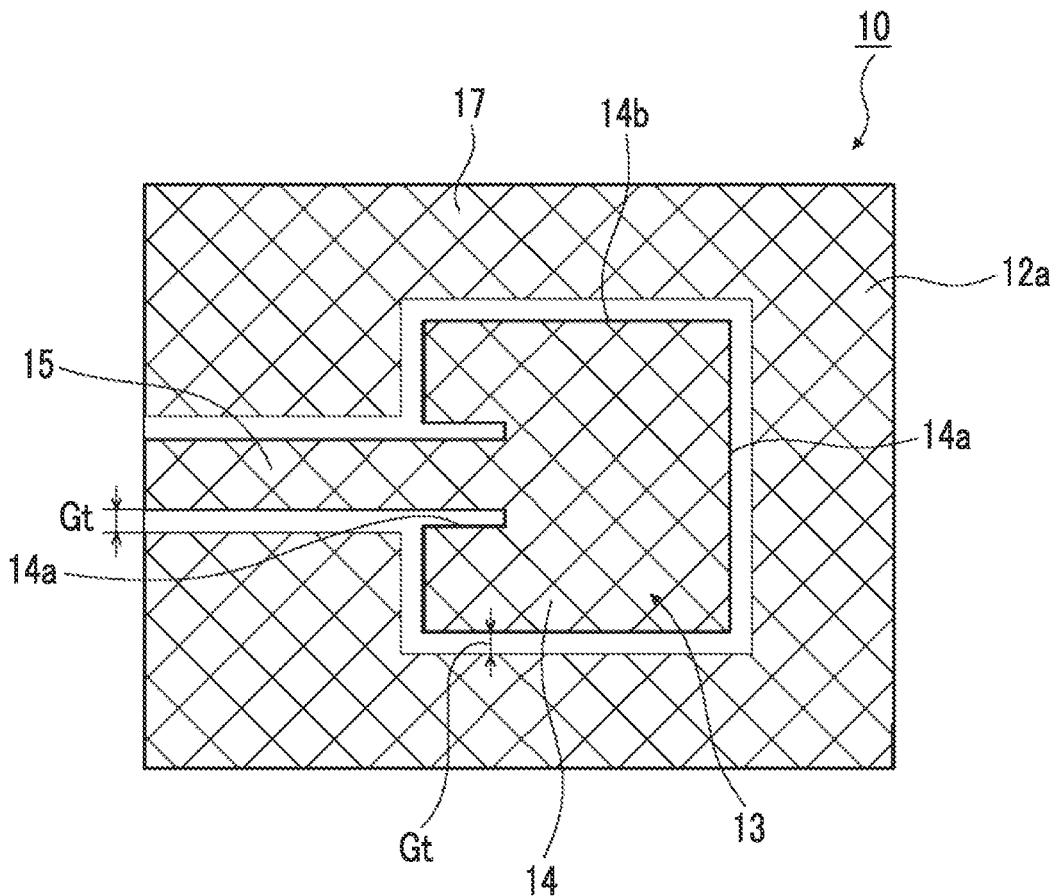
FIG. 14 is a schematic plan view showing still another example of the antenna according to the embodiment of the present invention.
Figure 15:
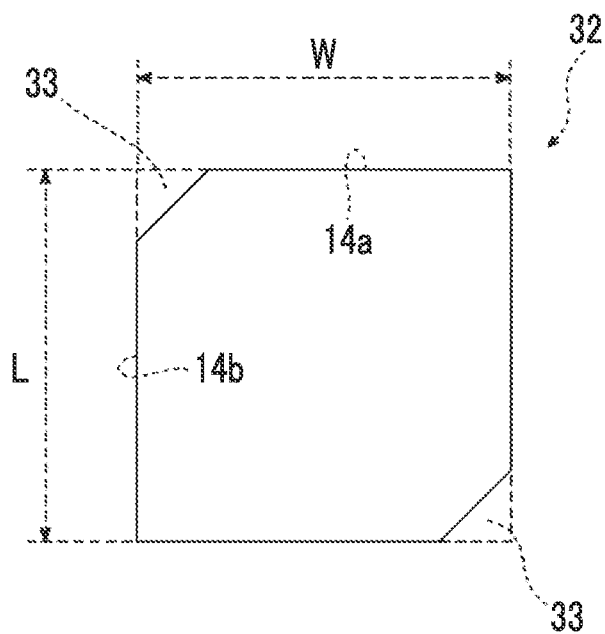
FIG. 15 is a schematic plan view showing another example of an antenna element of the antenna according to the embodiment of the present invention.

The antenna is not limited to the configuration of the antenna 10 shown in FIG. 1. Hereinafter, other examples of the antenna will be described. FIG. 13 is a schematic plan view showing another example of the antenna according to the embodiment of the present invention. FIG. 14 is a schematic plan view showing still another example of the antenna according to the embodiment of the present invention. FIG. 15 is a schematic plan view showing another example of the antenna element of the antenna according to the embodiment of the present invention. In FIGS. 13 to 15, the same structures as the antenna 10 shown in FIG. 1 are represented by the same reference numeral, and the detailed description will not be repeated. FIGS. 13 and 15 do not show the mesh pattern.

The antenna 10 shown in FIG. 13 is different from the antenna 10 shown in FIG. 1, in that the feeding line 15 is not inserted into the antenna element 14, and the other configurations are the same as those of the antenna 10 shown in FIG. 1. In the antenna 10 shown in FIG. 13, the insertion amount R (refer to FIG. 2) is zero.

In addition, as in the antenna 10 shown in FIG. 14, a dummy pattern unit 17 may be provided around the antenna part 13. The dummy pattern unit 17 is provided at an interval Gt from the antenna part 13. In the interval Gt, the mesh pattern is not formed. Due to the interval Gt, the antenna part 13 and the dummy pattern unit 17 are not electrically connected. In the antenna shown in FIG. 14, lines representing the contour of the antenna 10 and the contour of the dummy pattern unit 17 are not actually present.

The width of the interval Gt is preferably 5 μm or more and 50 μm or less and more preferably 7 μm or more and 20 μm or less. In a case where the interval Gt is in the above-described range, the antenna part 13 and the dummy pattern unit 17 are not electrically connected, and the visible recognition of the dummy pattern unit 17 is also suppressed. The length of a conduction portion in the dummy pattern unit 17 is preferably ¼ or less and more preferably 1/10 or less with respect to a resonance wavelength of the antenna.

The dummy pattern unit 17 is provided at the interval Gt from the antenna part 13 but is not limited thereto. Instead of providing the interval Gt where the mesh pattern is not formed, the antenna part 13 and the dummy pattern unit 17 may be formed. In this case, the antenna part 13 and the dummy pattern unit 17 are not electrically connected by cutting a part of the fine wire 20 forming the mesh pattern and providing a disconnected portion to enter a non-conduction state.

In addition, the antenna element 14 of the antenna 10 shown in FIG. 1, the antenna element 14 of the antenna 10 shown in FIG. 13, and the antenna element 14 of the antenna 10 shown in FIG. 14 have the same shape which is a quadrangular shape, but is not limited thereto. As in an antenna element 32 shown in FIG. 15, a notched portion 33 where corners diagonally facing each other are cut may be provided. The antenna element 32 generates circularly polarized waves. The antenna element 32 shown in FIG. 15 is used for transmission and reception of left-handed circularly polarized waves. By providing the notched portions on a diagonal line different from that of the antenna element 32 shown in FIG. 15, right-handed circularly polarized waves can be transmitted and received.

Except for the above-described configuration, the antenna element may have, for example, a circular shape or an elliptical shape or may have a polygonal shape such as a triangular shape.

The feeding line is not particularly limited as long as impedance matching can be performed, and may have a loop shape or an L-shape.

In addition, the antenna is not limited to the patch antenna as in the antenna 10 shown in FIG. 1 and may also be a slot antenna.

In addition, as shown in FIGS. 9 to 12, even in the antenna arrays 30, 30a, 30b, and 30c, the dummy pattern unit 17 (FIG. 14) may be formed on the front surface 12a of the transparent film substrate 12 where the antenna 10 is formed. In the dummy pattern unit 17, the interval Gt may be provided as shown in FIG. 14. In addition, the dummy pattern unit 17 may be formed without providing the interval Gt. In this case, as described above, the antenna part 13 and the dummy pattern unit 17 are not electrically connected by cutting a part of the fine wire 20 forming the mesh pattern and providing a disconnected portion to enter a non-conduction state.

Even in the antenna arrays 30, 30a, 30b, and 30c shown in FIGS. 9 to 12, the antenna element 32 shown in FIG. 15 can be used as the antenna element 14 of the antenna 10.

(Installation Position of Antenna)

The installation position of the antenna is not particularly limited. Examples of the installation position of the transparent antenna include a window of a building (JP2006-287729A), glass of an automobile (U.S. Pat. No. 7,656,357), a display unit of a mobile terminal (US20140106684 and U.S. Pat. No. 7,847,753), a touch panel (WO2019/223713A), and a housing portion (US20180342789).

In addition, the antenna as a glass antenna where a film substrate is interposed between laminated glasses is provided in the above-described installation positions (WO2019/107514A). In addition, the antenna as a film type antenna having bendability can also be provided on a curved surface in order to improve the designability or the directivity of the antenna.

However, in a case where the antenna is provided in a window, a display unit of a terminal, or a housing portion of a terminal, environmental tolerance is further required as compared to a case where the antenna is provided inside a device. For example, ultraviolet (UV) resistance and low hygroscopicity are more strongly required. In this case, it is preferable to introduce a method of strengthening environmental tolerance as described in JP6355824B (UV-resistant optical clear adhesive (OCA)) or JP5849059B (low hygroscopicity).

<Method of Manufacturing Antenna>

Next, a method of manufacturing the antenna will be described.

The method of manufacturing the antenna is not particularly limited as long as the antenna having the above-described configuration can be manufactured. From the viewpoint of productivity, a method of manufacturing a conductive substrate including steps A to E described below in this order is preferable. Hereinafter, each of the steps will be described in detail.

<Step A>

The step A is a step of forming a silver halide-containing photosensitive layer (hereinafter, also referred to as "photosensitive layer") including silver halide and gelatin, and a polymer other than gelatin (hereinafter, also referred to as "specific polymer") on a transparent film substrate. Through the above-described step, the transparent film substrate with the photosensitive layer on which an exposure treatment described below is performed is manufactured.

First, the materials and the members used in the step A will be described in detail. Next, the procedure of the step A will be described in detail.

(Transparent Film Substrate)

On the transparent film substrate, the antenna part and the ground part formed of the fine silver wire as described above are formed. The kind of the transparent film substrate is not particularly limited as long as it can support the photosensitive layer and the antenna part and the ground part formed of the fine silver wire.

The transparent film substrate is transparent, in which, for example, the total light transmittance is preferably 85% to 100%. The total light transmittance is measured using "Plastics—Determination of Total Luminous Transmittance And Reflectance" defined by JIS K 7375:2008.

In addition, it is preferable that the transparent film substrate has flexibility. A substrate having flexibility refers to a substrate that can be bent and specifically refers to a substrate that is not broken even after being bent at a bending curvature radius of 2 mm. The transparent film substrate can have workability to the degree that it can be formed in a three-dimensional shape. By using the transparent film substrate having flexibility, the antenna has flexibility.

As a material forming the transparent film substrate, a resin having a melting point of about 290° C. or lower such as polyethylene terephthalate (PET) (258° C.), polycycloolefin (134° C.), polycarbonate (250° C.), an acrylic film (128° C.), polyethylene naphthalate (269° C.), polyethylene (135° C.), polypropylene (163° C.), polystyrene (230° C.), polyvinyl chloride (180° C.), polyvinylidene chloride (212° C.), or triacetyl cellulose (290° C.) is preferable, and PET, polycycloolefin, or polycarbonate is more preferable. Among these, PET is most preferable from the viewpoint of excellent adhesiveness with the fine silver wire. The numerical value in the brackets is the melting point or the glass transition temperature.

The thickness h (refer to FIGS. 1 and 2) of the transparent film substrate is 30 µm or more and 300 µm or less as described above. In a case where the thickness h of the transparent film substrate is less than 30 µm, the antenna part and the ground part cannot be sufficiently ensured. On the other hand, in a case where the thickness h of the transparent film substrate is more than 300 µm, it is difficult to bend the transparent film substrate.

The transparent film substrate is lighter than the glass substrate, which is preferable. However, from the viewpoint of impedance matching, it is necessary to narrow the width of the antenna element and the feeding line. In the antenna, the line width of the fine silver wire is adjusted as described above in order to simultaneously achieve low transmission loss and visibility.

An undercoat layer may be disposed on the surface of the transparent film substrate.

It is preferable that the undercoat layer includes the specific polymer described below. By using the undercoat layer, adhesiveness of the fine silver wire described below with the transparent film substrate can be further improved.

A method of forming the undercoat layer is not particularly limited, and examples thereof include a method of applying a composition for forming an undercoat layer including the specific polymer to the transparent film substrate and optionally heating the composition for forming an undercoat layer. Optionally, the composition for forming an undercoat layer may include a solvent. The kind of the solvent is not particularly limited, and examples thereof include a solvent used for a composition for forming a photosensitive layer described below. In addition, as the composition for forming an undercoat layer including the specific polymer, a latex including particles of the specific polymer may be used.

The thickness of the undercoat layer is not particularly limited and, from the viewpoint of further improving the adhesiveness of the fine wire with the transparent film substrate is preferably 0.02 to 0.3 µm and more preferably 0.03 to 0.2 µm.

(Silver Halide)

The halogen atom in the silver halide may be any one of a chlorine atom, a bromine atom, an iodine atom, or a fluorine atom and may be a combination thereof. For example, a silver halide mainly formed of silver chloride, silver bromide, or silver iodide is preferable, and a silver halide mainly formed of silver chloride or silver bromide is more preferable. Silver chlorobromide, silver iodochlorobromide, or silver iodobromide is also preferably used.

Here, for example, "the silver halide mainly formed of silver chloride" refers to a silver halide in which the molar fraction of chloride ions to all of the halide ions in the silver halide composition is 50% or more. The silver halide mainly formed of silver chloride may include bromide ions and/or iodide ions in addition to the chloride ions.

The silver halide typically has a solid particle shape, and the average particle diameter of the silver halide is, in terms of sphere equivalent diameter, preferably 10 to 1000 nm, more preferably 10 to 200 nm, and still more preferably 50 to 150 nm from the viewpoint of further reducing a change in the resistance value of the fine silver wire in a hot humid environment.

The sphere equivalent diameter refers to the diameter of a spherical particle having the same volume.

"The sphere equivalent diameter" used as the average particle diameter of the silver halide is an average value and is obtained by measuring the sphere equivalent diameters of 100 silver halide particles and obtaining the average thereof.

The shape of the silver halide particles is not particularly limited, and examples thereof include a spherical shape, a cubic shape, a flat plate shape (a hexagonal flat plate shape, a triangular flat plate shape, a quadrangular flat plate shape, or the like), an octahedron shape, and a tetradecahedron shape.

(Gelatin)

The kind of the gelatin is not particularly limited, and examples thereof include lime-treated gelatin and acid-treated gelatin. In addition, a hydrolyzate of gelatin, an enzymatic decomposition product of gelatin, or gelatin modified with an amino group and/or a carboxyl group (phthalated gelatin or acetylated gelatin) may also be used.

(Polymer Other than Gelatin)

The photosensitive layer includes the polymer other than gelatin. The photosensitive layer includes the specific polymer such that the strength of the fine silver wire formed of the photosensitive layer is further improved.

The kind of the specific polymer is not particularly limited as long as it is different from gelatin, and a polymer described below that decomposes gelatin and is not decomposed by a proteolytic enzyme or an oxidant is preferable.

As the specific polymer, a hydrophobic polymer (water-insoluble polymer) can be used, and examples thereof include at least one resin selected from the group consisting of a (meth)acrylic resin), a styrene resin, a vinyl resin, a polyolefin resin, a polyester resin, a polyurethane resin, a polyamide resin, a polycarbonate resin, a polydiene resin, an epoxy resin, a silicone resin, a cellulose polymer, and a chitosan polymer or a copolymer that is formed of monomers forming the resins.

In addition, it is preferable that the specific polymer has a reactive group that reacts with a crosslinking agent described below.

It is preferable that the specific polymer has a particle shape. That is, it is preferable that the photosensitive layer includes particles of the specific polymer.

As the specific polymer, a polymer (copolymer) represented by Formula (1) is preferable.

-(A)$_x$-(B)$_y$-(C)$_z$-(D)$_w$-      Formula (1):

In Formula (1), A, B, C, and D represent repeating units represented by Formulae (A) to (D), respectively.

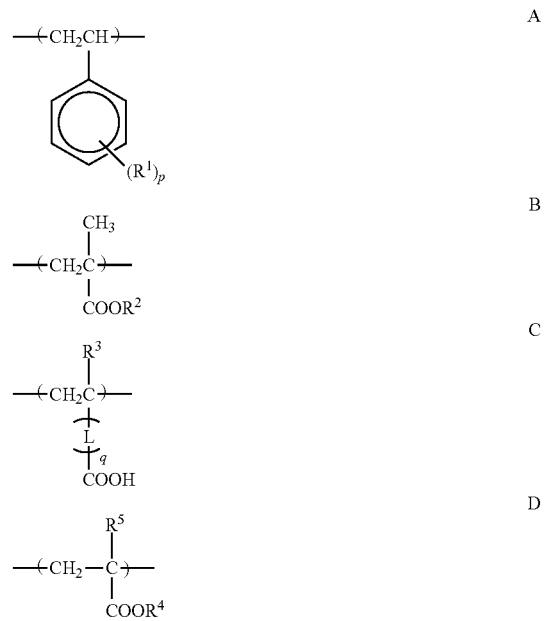

$R^1$ represents a methyl group or a halogen atom and preferably a methyl group, a chlorine atom, or a bromine atom. p represents an integer of 0 to 2, and it is preferably 0 or 1 and more preferably 0.

$R^2$ represents a methyl group or an ethyl group and preferably a methyl group.

$R^3$ represents a hydrogen atom or a methyl group and preferably a hydrogen atom. L represents a divalent linking group, and preferably a group represented by Formula (2).

—(CO—X$^1$)$r$-X$^2$—      Formula (2):

In Formula (2), $X^1$ represents an oxygen atom or NR$^{30}$—. Here, $R^{30}$ represents a hydrogen atom, an alkyl group, an aryl group, or an acyl group, each of which may have a substituent (for example, a halogen atom, a nitro group, or a hydroxyl group). $R^{30}$ represents preferably a hydrogen atom, an alkyl group having 1 to 10 carbon atoms (for example, a methyl group, an ethyl group, an n-butyl group, or an n-octyl group), or an acyl group (for example, an acetyl group or a benzoyl group). $X^1$ represents preferably an oxygen atom or NH—.

$X^2$ represents an alkylene group, an arylene group, an alkylene arylene group, an arylene alkylene group, or an alkylene arylene alkylene group, and —O—, —S—, —CO—, —COO—, —NH—, —SO$_2$—, —N(R$^{31}$)—, —N(R$^{31}$)SO$_2$—, or the like may be inserted into this group in the middle. $R^{31}$ represents a linear or branched alkyl group having 1 to 6 carbon atoms. As $X^2$, a dimethylene group, a trimethylene group, a tetramethylene group, an o-phenylene group, an m-phenylene group, a p-phenylene group, —CH$_2$CH$_2$OCOCH$_2$CH$_2$—, or —CH$_2$CH$_2$OCO(C$_6$H$_4$)— is preferable.

r represents 0 or 1.

q represents 0 or 1 and preferably 0.

$R^4$ represents an alkyl group, an alkenyl group, or an alkynyl group, preferably an alkyl group having 5 to 50 carbon atoms, more preferably an alkyl group having 5 to 30 carbon atoms, and still more preferably an alkyl group having 5 to 20 carbon atoms.

$R^5$ represents a hydrogen atom, a methyl group, an ethyl group, a halogen atom, or —CH$_2$COOR$^6$—, preferably a hydrogen atom, a methyl group, a halogen atom, or —CH$_2$COOR$^6$—, more preferably a hydrogen atom, a methyl group, or —CH$_2$COOR$^6$—, and still more preferably a hydrogen atom.

R$^6$ represents a hydrogen atom or an alkyl group having 1 to 80 carbon atoms and may be the same as or different from R$^4$. The number of carbon atoms in R$^6$ is preferably 1 to 70 and more preferably 1 to 60.

In Formula (1), x, y, z, and w represent a molar ratio of each repeating unit.

x represents 3 to 60 mol %, preferably 3 to 50 mol %, and more preferably 3 to 40 mol %.

y represents 30 to 96 mol %, preferably 35 to 95 mol %, and more preferably 40 to 90 mol %.

z represents 0.5 to 25 mol %, preferably 0.5 to 20 mol %, and more preferably 1 to 20 mol %.

w represents 0.5 to 40 mol % and preferably 0.5 to 30 mol %.

In Formula (1), it is preferable that x represents 3 to 40 mol %, y represents 40 to 90 mol %, z is 0.5 to 20 mol %, and w represents 0.5 to 10 mol %.

As the polymer represented by Formula (1), a polymer represented by Formula (2) is preferable.

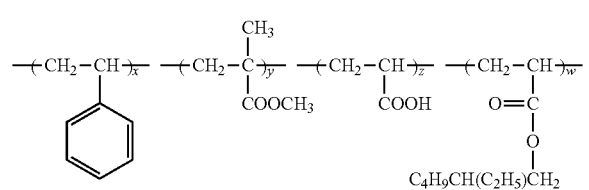

Formula (2)

In Formula (2), x, y, z, and w are as defined above.

The polymer represented by Formula (1) may include repeating units other than the repeating units represented by Formulae (A) to (D).

Examples of a monomer for forming the other repeating units include acrylates, methacrylates, vinyl esters, olefins, crotonic acid esters, itaconic acid diesters, maleic acid diesters, fumaric acid diesters, acrylamides, unsaturated carboxylic acids, allyl compounds, vinyl ethers, vinyl ketones, heterocyclic vinyl compounds, glycidyl esters, and unsaturated nitriles. These monomers are also described in paragraphs "0010" to "0022" of JP3754745B. From the viewpoint of hydrophobicity, acrylates or methacrylates are preferable, and hydroxyalkyl methacrylate or hydroxyalkyl acrylate is more preferable.

It is preferable that the polymer represented by Formula (1) includes a repeating unit represented by Formula (E).

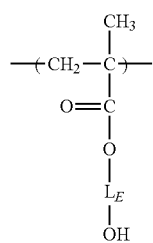

E

In the formula, L$_E$ represents an alkylene group, preferably an alkylene group having 1 to 10 carbon atoms, more preferably an alkylene group having 2 to 6 carbon atoms, and still more preferably an alkylene group having 2 to 4 carbon atoms.

As the polymer represented by Formula (1), a polymer represented by Formula (3) is more preferable.

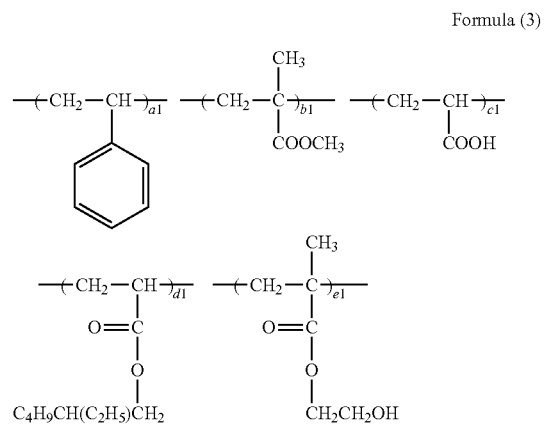

Formula (3)

In the formula, a1, b1, c1, d1, and e1 represent molar ratios of the repeating units, a1 represents 3 to 60 (mol %), b1 represents 30 to 95 (mol %), c1 represents 0.5 to 25 (mol %), d1 represents 0.5 to 40 (mol %), and e1 represents 1 to 10 (mol %).

The preferable range of a1 is the same as the preferable range of the x described above, the preferable range of b1 is the same as the preferable range of the y described above, the preferable range of c1 is the same as the preferable range of the z described above, and the preferable range of d1 is the same as the preferable range of the w described above.

e1 represents 1 to 10 mol %, preferably 2 to 9 mol %, and more preferably 2 to 8 mol %.

The specific polymer can be synthesized, for example, with respect to JP3305459B and JP3754745B.

The weight-average molecular weight of the specific polymer is not particularly limited and is preferably 1000 to 1000000, more preferably 2000 to 750000, and still more preferably 3000 to 500000.

Optionally, the photosensitive layer may include materials other than the above-described materials.

Examples of the other materials include metal compounds belonging to group 8 and group 9, for example, a rhodium compound or an iridium compound used for stabilizing silver halide and increasing the sensitivity. Other examples of the other materials include an antistatic agent, a nucleation accelerator, a spectral sensitizing dye, a surfactant, an antifoggant, a hardening agent, a black pepper inhibitor, a redox compound, a monomethine compound, and dihydroxybenzenes described in paragraphs "0220" to "0241" of JP2009-004348A. Further, the photosensitive layer may include physical development nuclei.

In addition, the photosensitive layer may include a crosslinking agent used for crosslinking the above-described specific polymers. By including the crosslinking agent, crosslinking between the specific polymers progresses, and even in a case where gelatin is decomposed and removed, linking between the metallic silver particles in the fine wire is maintained.

(Procedure of Step A)

In the step A, a method of forming the photosensitive layer including the above-described components is not particularly limited. From the viewpoint of productivity, a method of forming the photosensitive layer on the transparent film substrate by bringing the composition for forming a photosensitive layer including silver halide, gelatin, and the specific polymer into contact with the transparent film substrate is preferable.

Hereinafter, a configuration of the composition for forming a photosensitive layer used in this method will be described in detail. Next, the procedure of the step will be described in detail.

(Materials in Composition for Forming Photosensitive Layer)

The composition for forming a photosensitive layer includes silver halide, gelatin, and the specific polymer. Optionally, the specific polymer may be included in the composition for forming a photosensitive layer in the form of a particle shape.

Optionally, the composition for forming a photosensitive layer may include a solvent.

Examples of the solvent include water, organic solvents (for example, alcohols, ketones, amides, sulfoxides, esters, and ethers), ionic liquids, and mixed solvents thereof.

A method of bringing the composition for forming a photosensitive layer and the transparent film substrate into contact with each other is not particularly limited, and examples thereof include a method of applying the composition for forming a photosensitive layer to the transparent film substrate and a method of dipping the transparent film substrate in the composition for forming a photosensitive layer.

After the above-described treatment, optionally, a drying treatment may be performed.

(Silver Halide-Containing Photosensitive Layer)

The photosensitive layer formed through the above-described procedure includes silver halide, gelatin, and the specific polymer.

The content of the silver halide in the photosensitive layer is not particularly limited and, from the viewpoint of further improving the conductivity of the conductive film, is preferably 3.0 to 20.0 $g/m^2$ and more preferably 5.0 to 15.0 $g/m^2$ in terms of silver.

"In terms of silver" refers to conversion into the mass of silver that is reduced and produced from all of the silver halide.

The content of the specific polymer in the photosensitive layer is not particularly limited and, from the viewpoint of further improving the conductivity of the conductive film, is preferably 0.04 to 2.0 $g/m^2$, more preferably 0.08 to 0.40 $g/m^2$, and still more preferably 0.10 to 0.40 $g/m^2$.

<Step B>

The step B is a step of exposing and developing the photosensitive layer to form a silver-containing layer having a fine linear shape that includes metallic silver, gelatin, and the polymer.

By exposing the photosensitive layer, a latent image is formed on the exposed region.

The exposure may be performed in a patterned manner. For example, in order to obtain the mesh pattern formed of the fine silver wire described below, a method of exposing the photosensitive layer through a mask having a mesh-like opening pattern or a method of scanning the photosensitive layer with laser light to expose the photosensitive layer in a mesh shape can be adopted.

The kind of light used for the exposure is not particularly limited as long as a latent image can be formed on the silver halide. Examples of the light include visible light, ultraviolet light, and an X-ray.

By developing the exposed photosensitive layer, metallic silver is deposited on the exposed region (the region where the latent image is formed).

A method of the development treatment is not particularly limited, and examples thereof include a well-known method used for a silver halide photographic film, photographic printing paper, a printing plate making film, or an emulsion mask for a photomask.

In the development treatment, typically, a developer is used. The kind of the developer is not particularly limited, and examples thereof include a phenidone hydroquinone (PQ) developer, a metol hydroquinone (MQ) developer, and a metol ascorbic acid (MAA) developer.

This step may further include a fixing treatment that is performed in order to remove the silver halide in the non-exposed portion for stabilization.

The fixing treatment is performed during and/or after the development. A method of the fixing treatment is not particularly limited, and examples thereof include a method used for a silver halide photographic film, photographic printing paper, a printing plate making film, or an emulsion mask for a photomask.

In the fixing treatment, typically, a fixing solution is used. The kind of the fixing solution is not particularly limited, and examples thereof include a fixing solution described in "Chemistry of Photography" (Sasai, manufactured by Shashin Kogyo Co., Ltd), p. 321.

By performing the above-described treatment, the silver-containing layer having a fine linear shape that includes metallic silver, gelatin, and the specific polymer is formed.

Examples of a method of adjusting the width of the silver-containing layer include a method of adjusting the opening width of a mask used for the exposure. For example, by adjusting the opening width of the mask to be 1.0 μm or more and less than 5.0 μm, the exposed region can be adjusted.

In addition, in a case where the mask is used for the exposure, by adjusting the exposure amount, the width of the silver-containing layer to be formed can also be adjusted. For example, in a case where the opening width of the mask is narrower than the desired width of the silver-containing layer, by increasing the exposure amount to be more than a typical amount, the width of the region where the latent image is formed can be adjusted. That is, the line width of the fine silver wire can be adjusted depending on the exposure amount.

Further, in a case where laser light is used, the exposed region can be adjusted by adjusting a light collecting range and/or a scanning range of the laser light.

The width of the silver-containing layer is preferably 1.0 μm or more and less than 5.0 μm and, from the viewpoint of the inconspicuousness of the fine silver wire to be formed, more preferably 3.7 μm or less.

The silver-containing layer obtained through the above-described procedure has a fine linear shape, and the width of the silver-containing layer refers to the length (width) of the silver-containing layer in a direction perpendicular to a direction in which the silver-containing layer having a fine linear shape extends.

<Step C>

The step C is a step of heating the silver-containing layer obtained in the step B. By performing this step, fusion welding between the specific polymers in the silver-containing layer progresses, and the strength of the silver-containing layer is improved.

A method of the heat treatment is not particularly limited, and examples thereof include a method of bringing the silver-containing layer and superheated vapor into contact with each other and a method of heating the silver-containing layer in a temperature control device (for example, a heater). Among these, the method of bringing the silver-containing layer and superheated vapor into contact with each other is preferable.

The superheated vapor may be superheated steam or may be a mixture obtained by mixing superheated steam with another gas.

The contact time of the superheated vapor and the silver-containing layer is not particularly limited and is preferably 10 to 70 seconds.

The supply amount of the superheated vapor is preferably 500 to 600 g/m$^3$, and the temperature of the superheated vapor at 1 atm is preferably 100° C. to 160° C. (preferably 100° C. to 120° C.).

Preferable heating conditions in the method of heating the silver-containing layer in a temperature control device are 100° C. to 200° C. (preferably 100° C. to 150° C.) and 1 to 240 minutes (preferably 60 to 150 minutes).

<Step D>

The step D is a step of removing gelatin in the silver-containing layer obtained in the step C. By performing this step, the gelatin is removed from the silver-containing layer, and a space is formed in the silver-containing layer.

A method of removing gelatin is not particularly limited, and examples thereof include a method of using a proteolytic enzyme (hereinafter, also referred to as "method 1") and a method of decomposing and removing gelatin using an oxidant (hereinafter, also referred to as "method 2").

Examples of the proteolytic enzyme used in the method 1 include a well-known enzyme such as a vegetable or animal enzyme that can hydrolyze a protein such as gelatin.

Examples of the proteolytic enzyme include pepsin, rennin, trypsin, chymotrypsin, cathepsin, papain, ficin, thrombin, renin, collagenase, bromelain, and bacterial protease. Among these, trypsin, papain, ficin, or bacterial protease is preferable.

The procedure of the method 1 only needs to be a method of bringing the silver-containing layer and the above-described proteolytic enzyme into contact with each other, and examples thereof include a method of bringing the silver-containing layer and a treatment liquid (hereinafter, also referred to as "enzyme liquid") including the proteolytic enzyme into contact with each other. Examples of the contact method include a method of dipping the silver-containing layer in the enzyme liquid and a method of applying the enzyme liquid to the silver-containing layer.

The content of the proteolytic enzyme in the enzyme liquid is not particularly limited and, from the viewpoint of easily controlling the degree to which the gelatin is decomposed and removed, is preferably 0.05 to 20 mass % and more preferably 0.5 to 10 mass % with respect to the total amount of the enzyme liquid.

The enzyme liquid typically includes water in addition to the above-described proteolytic enzyme.

Optionally, the enzyme liquid may include other additives (for example, a pH buffer agent, an antimicrobial compound, a wetting agent, and a preservative).

The pH of the enzyme liquid is selected such that the action of the enzyme is maximized, and in general, is preferably 5 to 9.

The temperature of the enzyme liquid is preferably a temperature at which the action of the enzyme increases, specifically, 25° C. to 45° C.

Optionally, after the treatment with the enzyme liquid, a cleaning treatment of cleaning the obtained silver-containing layer with warm water may be performed.

A cleaning method is not particularly limited, and a method of bringing the silver-containing layer and warm water into contact with is preferable, and examples thereof include a method of dipping the silver-containing layer in warm water and a method of applying warm water to the silver-containing layer.

As the temperature of the warm water, an appropriately optimum temperature for the kind of the proteolytic enzyme to be used is selected, and from the viewpoint of productivity, is preferably 20° C. to 80° C. and more preferably 40° C. to 60° C.

The contact time (cleaning time) of the warm water and the silver-containing layer is not particularly limited and, from the viewpoint of productivity, is preferably 1 to 600 seconds and more preferably 30 to 360 seconds.

The oxidant used in the method 2 only needs to be an oxidant that can decompose gelatin, and an oxidant having a standard electrode potential of +1.5 V or higher is preferable. Here, the standard electrode potential refers to a standard electrode potential (25° C., E0), relative to a standard hydrogen electrode in an aqueous solution of the oxidant.

Examples of the oxidant include persulfuric acid, percarbonic acid, perphosphoric acid, peroxoperchloric acid, peracetic acid, meta-chloroperbenzoic acid, hydrogen peroxide water, perchloric acid, periodic acid, potassium permanganate, ammonium persulfate, ozone, hypochlorous acid, and salts thereof. From the viewpoint of productivity and economical efficiency, hydrogen peroxide water (standard electrode potential: 1.76 V), hypochlorous acid, or a salt thereof is preferable, and sodium hypochlorite is more preferable.

The procedure of the method 2 only needs to be a method of bringing the silver-containing layer and the above-described oxidant into contact with each other, and examples thereof include a method of bringing the silver-containing layer and a treatment liquid (hereinafter, also referred to as "oxidant liquid") including the oxidant into contact with each other. Examples of the contact method include a method of dipping the silver-containing layer in the oxidant liquid and a method of applying the oxidant liquid to the silver-containing layer.

The kind of the solvent in the oxidant liquid is not particularly limited, and examples thereof include water and an organic solvent.

<Step E>

The step E is a step of performing a plating treatment on the silver-containing layer obtained in the step D to obtain the fine silver wire. By performing this step, the fine silver wire where the space formed by removing the gelatin is filled with metal (plating metal) is formed.

The kind of the plating treatment is not particularly limited, and examples thereof include electroless plating (chemical reduction plating or immersion plating) and electrolytic plating. Among these, electroless plating is preferable. As the electroless plating, a well-known electroless plating technique is used. As the plating treatment, a silver plating treatment is more preferable.

Components in the plating liquid used in the plating treatment are not particularly limited. In addition to the solvent (for example, water), typically, the plating liquid mainly includes 1. metal ions for plating, 2. a reducing agent, 3. an additive (stabilizer) for improving the stability of the metal ions, and 4. a pH adjuster. This plating bath may further include a well-known additive such as a stabilizer of a plating bath in addition to the above-described components.

The kind of the metal ions for plating in the plating liquid is appropriately selected depending on the metal species to be deposited, and silver ions are used.

The procedure of the plating treatment is not particularly limited and only needs to be a method of bringing the silver-containing layer and the plating liquid into contact with each other. For example, a method of dipping the silver-containing layer in the plating liquid may be adopted.

The contact time of the silver-containing layer and the plating liquid is not particularly limited and is preferably 1 to 30 minutes from the viewpoints of further improving the conductivity of the fine silver wire and the productivity. By adjusting the plating treatment time, the vol % of the silver particles can be changed. By increasing the plating treatment time, the proportion of the silver particles can be increased, and the vol % of the silver particles can be increased.

<Step F>

The method of manufacturing the antenna according to the embodiment of the present invention may further include a step F of smoothing the fine silver wire obtained in the step E after the step E.

By performing this step, the fine silver wire having higher conductivity can be obtained.

A method of the smoothing treatment is not particularly limited. For example, a calendar treatment step of causing the transparent film substrate including the fine silver wire to pass through at least a pair of rolls under pressure is preferable. Hereinafter, the smoothing treatment using the calendar roll will be referred to as the calendar treatment.

Figure 16:
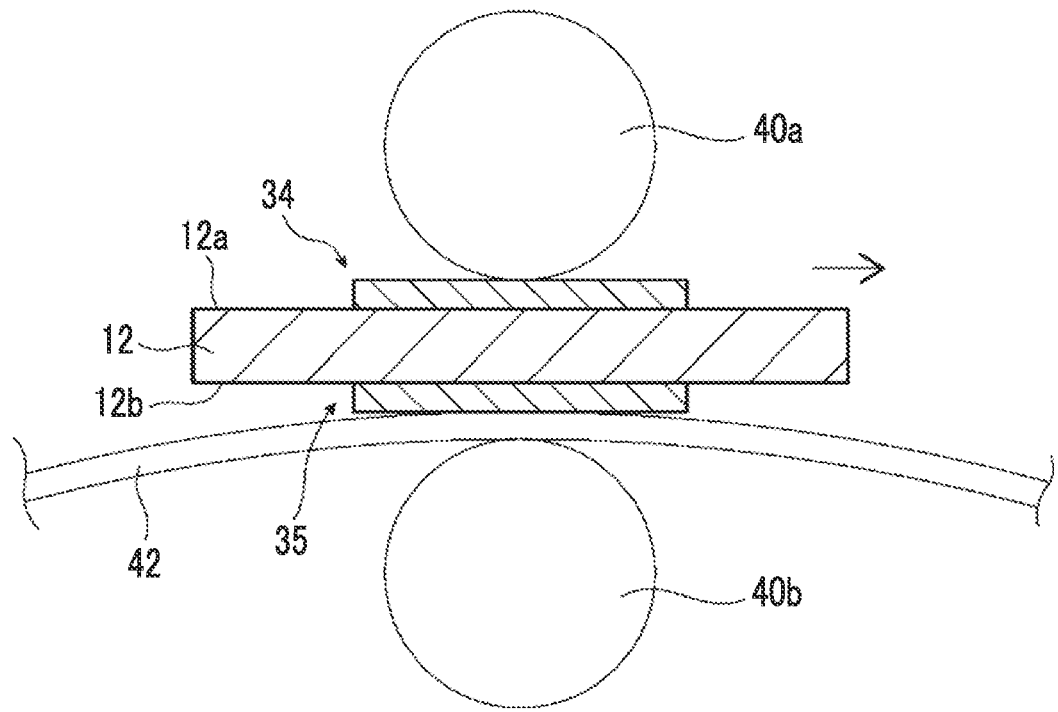
FIG. 16 is a schematic diagram showing an example of a calendar treatment for manufacturing the antenna according to the embodiment of the present invention.

Here, FIG. 16 is a schematic diagram showing an example of the calendar treatment for manufacturing the antenna according to the embodiment of the present invention.

In the calendar treatment, as shown in FIG. 16, a first calendar roller 40a and a second calendar roller 40b that are disposed to face each other are used.

In addition, during the calendar treatment, a co-conveying mat 42 that is conveyed together with the transparent film substrate 12 is used.

A fine wire 34 is formed on the front surface 12a side of the transparent film substrate 12, and a fine wire 35 is formed on the back surface 12b side of the transparent film substrate 12. The fine wire 34 is the fine wire 20 forming the above-described antenna part 13. The fine wire 35 is the fine wire 20 forming the above-described ground part 16.

Examples of the first calendar roller 40a and the second calendar roller 40b used for the calendar treatment include a plastic roll and a metal roll. From the viewpoint of preventing wrinkles, a plastic roll is preferable.

The pressure between the rolls is not particularly limited and is preferably 2 MPa or more, more preferably 4 MPa or more and is preferably 120 MPa or less. The pressure between the rolls can be measured using PRESCALE (for high pressure) manufactured by FUJIFILM Corporation.

The temperature of the smoothing treatment is not particularly limited and is preferably 10° C. to 100° C. and more preferably 10° C. to 50° C.

By performing the calendar treatment, the co-conveying mat 42 controls the surface shape of the fine wire 34 and the fine wire 35 as described above. In the co-conveying mat 42, for example, a film material used for the calendar treatment described in JP2016-118819A can be used.

In the calendar treatment, the co-conveying mat 42 is laminated on the fine wire 35 on the back surface 12b side of the transparent film substrate 12. In this state, the laminate is pressed by the first calendar roller 40a and the second calendar roller 40b to control the surface shape of the fine wire 35, and the fine wire 20 having the surface roughness Rq(A) and Rq(B) can be obtained.

The surface roughness Rq(A) and Rq(B) can be adjusted depending on the materials of the first calendar roller 40a and the second calendar roller 40b, the surface roughness of the first calendar roller 40a and the second calendar roller 40b, the material of the co-conveying mat, the pressure between the rolls during the calendar treatment, the temperature during the calendar treatment, and the like.

In the calendar treatment, the surface shape of the fine wire 20 on the transparent film substrate is controlled, the fine wire 20 is inconspicuous, and a conductive material in which the electric resistance is low and the visibility, conductivity, and the disconnection rate are improved can be manufactured. The co-conveying mat 42 does not need to be used.

<Step G>

The method of manufacturing the antenna according to the embodiment of the present invention may further include a step G of heating the fine silver wire obtained in the step F after the step F. By performing this step, the fine silver wire having higher conductivity can be obtained.

A method of heating the fine silver wire is not particularly limited, and examples thereof include the methods described in the step C.

<Step H>

The method of manufacturing the antenna according to the embodiment of the present invention may further include a step H of forming a silver halide non-containing layer including gelatin and the specific polymer on the transparent film substrate before the step A. By performing this step, the silver halide non-containing layer is formed between the transparent film substrate and the silver halide-containing photosensitive layer. This silver halide non-containing layer also functions as a so-called antihalation layer and contributes to improvement of adhesiveness between the fine wire and the transparent film substrate.

The silver halide non-containing layer includes gelatin and the specific polymer as described above. On the other hand, the silver halide non-containing layer does not include silver halide.

In the silver halide non-containing layer, a ratio (mass of specific polymer/mass of gelatin) of the mass of the specific polymer to the mass of the gelatin is not particularly limited and is preferably 0.1 to 5.0 and more preferably 1.0 to 3.0.

The content of the specific polymer in the silver halide non-containing layer is not particularly limited and is more likely to be 0.03 g/m$^2$ or more. From the viewpoint of further improving the adhesiveness of the fine silver wire, the content is preferably 1.0 g/m$^2$ or more. The upper limit is not particularly limited and is likely to be 1.63 g/m$^2$ or less.

A method of forming the silver halide non-containing layer is not particularly limited, and examples thereof include a method of applying a composition for forming a layer including gelatin and the specific polymer to the transparent film substrate and optionally heating the composition for forming a layer.

Optionally, the composition for forming a layer may include a solvent. Examples of the kind of the solvent include the solvent used for the above-described composition for forming a photosensitive layer.

The thickness of the silver halide non-containing layer is not particularly limited and is more likely to be 0.05 μm or more. From the viewpoint of further improving the adhesiveness of the fine silver wire, the thickness is preferably more than 1.0 µm and more preferably 1.5 µm or more. The upper limit is not particularly limited and is preferably less than 3.0 µm.

<Step I>

The method of manufacturing the antenna according to the embodiment of the present invention may further include a step I of forming a protective layer including gelatin and the specific polymer on the silver halide-containing photosensitive layer before the step B and after the step A. By providing the protective layer, scratch prevention and mechanical characteristics of the photosensitive layer can be improved.

In the protective layer, a ratio (mass of specific polymer/mass of gelatin) of the mass of the specific polymer to the mass of the gelatin is not particularly limited and is preferably more than 0 and 2.0 or less and more preferably more than 0 and 1.0 or less.

In addition, the content of the specific polymer in the protective layer is not particularly limited and is preferably more than 0 g/m$^2$ and 0.3 g/m$^2$ or less and more preferably 0.005 to 0.1 g/m$^2$.

A method of forming the protective layer is not particularly limited, and examples thereof include a method of applying a composition for forming a protective layer including gelatin and the specific polymer to the silver halide-containing photosensitive layer and optionally heating the composition for forming a protective layer.

Optionally, the composition for forming a protective layer may include a solvent. Examples of the kind of the solvent include the solvent used for the above-described composition for forming a photosensitive layer.

The thickness of the protective layer is not particularly limited and is preferably 0.03 to 0.3 µm and more preferably 0.075 to 0.20 µm.

The step H, the step A, and the step I may be simultaneously performed by simultaneous multilayer application.

<Another Method of Manufacturing Antenna>

In the method of manufacturing the antenna, a method of manufacturing the fine silver wire is not limited to the above-described manufacturing method, and a well-known method can be adopted. For example, a method of exposing and developing a photoresist film on a silver foil formed on a surface of the transparent film substrate to form a resist pattern and etching the exposed silver foil through the resist pattern can be used. In addition, a method of printing a paste including silver fine particles or silver nanowires on the front surface and the back surface of the transparent film substrate and plating the paste with silver can be used. In addition, for example, a method of printing a pattern of ink including silver fine particles or silver nanowires on the transparent film substrate surface using an inkjet method to form the fine silver wire can be used. In addition, for example, a method of patterning the surface of the transparent film substrate to form a groove structure in advance and embedding a paste including silver fine particles or silver nanowires in the groove by screen printing can be used.

Basically, the present invention is configured as described above. Hereinabove, the antenna according to the embodiment of the present invention has been described in detail. However, the present invention is not limited to the above-described examples, and various improvements or modifications may be made within a range not departing from the scope of the present invention.

EXAMPLES

Hereinafter, the characteristics of the present invention will be described in detail using examples. Materials, reagents, amounts thereof, proportions thereof, operations, and the like shown in the following examples can be appropriately changed as long as they do not depart from the scope of the present invention. Accordingly, the scope of the present invention is not limited to the following examples.

In this example, Examples 1 to 17 and Comparative Examples 1 to 3 were evaluated for transmission loss, transmissive visibility, and reflective visibility as evaluation items. Hereinafter, Examples 1 to 17 and Comparative Examples 1 to 3 will be described. The transmissive visibility and the reflective visibility are evaluations regarding visibility.

Example 1

(Preparation of Silver Halide Emulsion)

The following solution 2 and the following solution 3 were simultaneously added for 20 minutes to the following solution 1 held at pH 4.5 and 38° C. in amounts corresponding to 90% of the entire amounts while stirring the solution 1. As a result, nuclear particles having a size of 0.16 µm were formed. Next, the following solution 4 and the following solution 5 were added to the obtained solution for 8 minutes, and the remaining 10% amounts of the solution 2 and the solution 3 were further added for 2 minutes. As a result, the nuclear particles grew to a size of 0.21 Further, 0.15 g of potassium iodide was added to the obtained solution, and the particles were aged for 5 minutes. Then the formation of the particles was completed.

Solution 1:

| | |
|---|---|
| Water | 750 ml |
| Gelatin | 8.6 g |
| Sodium chloride | 3 g |
| 1,3-Dimethylimidazolidine-2-thione | 20 mg |
| Sodium benzenethiolsulfonate | 10 mg |
| Citric acid | 0.7 g |

Solution 2:

| | |
|---|---|
| Water | 300 ml |
| Silver nitrate | 150 g |

Solution 3:

| | |
|---|---|
| Water | 300 ml |
| Sodium chloride | 38 g |
| Potassium bromide | 32 g |
| Potassium hexachloroiridate(III) (0.005% KCl 20% aqueous solution) | 5 ml |
| Ammonium hexachlororhodate (0.001% NaCl 20% aqueous solution) | 7 ml |

Solution 4:

| | |
|---|---|
| Water | 100 ml |
| Silver nitrate | 50 g |

Solution 5:

| | |
|---|---|
| Water | 100 ml |
| Sodium chloride | 13 g |
| Potassium bromide | 11 g |
| Yellow prussiate of potash | 5 mg |

Next, the particles were cleaned with water by flocculation using an ordinary method. Specifically, the temperature of the obtained solution was decreased to 35° C., and the pH was decreased (to be in a range of pH 3.6±0.2) using sulfuric acid until silver halide precipitated. Next, about 3 L of the supernatant solution was removed from the obtained solution (first water cleaning). Next, 3 L of distilled water was added to the solution from which the supernatant solution was removed, and sulfuric acid was added until silver halide precipitated. About 3 L of the supernatant solution was removed again from the obtained solution (second water cleaning). By repeating the same operation as the second water cleaning once more (third water cleaning), the water cleaning and desalting step was completed. After the water cleaning and desalting, the emulsion was adjusted to pH 6.4 and pAg 7.5, 2.5 g of gelatin, 10 mg of sodium benzenethiolsulfonate, 3 mg of sodium benzenethiosulfinate, 15 mg of sodium thiosulfate, and 10 mg of chloroauric acid were added, and chemosensitization was performed at 55° C. to obtain the optimum sensitivity. Next, 100 mg of 1,3,3a,7-tetraazaindene as a stabilizer and 100 mg of PROXEL (trade name, manufactured by ICI Co., Ltd.) as a preservative were further added to the obtained emulsion. The finally obtained emulsion was a silver chlorobromide cubic particle emulsion having an average particle diameter (sphere equivalent diameter) of 0.12 µm and a coefficient of variation of 9%, in which the content of silver iodide was 0.08 mol %, and the ratio of silver chlorobromide was 70 mol % of silver chloride/30 mol % of silver bromide.

(Preparation of Composition for Forming Photosensitive Layer)

1,3,3a,7-tetraazaindene ($1.2 \times 10^{-4}$ mol/mol Ag), hydroquinone ($1.2 \times 10^{-2}$ mol/mol Ag), citric acid ($3.0 \times 10^{-4}$ mol/mol Ag), 2,4-dichloro-6-hydroxy-1,3,5-triazine sodium salt (0.90 g/mol Ag), and a small amount of a hardening agent were added to the emulsion to obtain a composition. Next, the pH of the composition was adjusted to 5.6 using citric acid.

A polymer latex (a ratio (mass of dispersant/mass of polymer 1; unit: g/g) of the mass of the dispersant to the mass of a polymer 1 was 0.02 and the solid content was 22 mass %) including a polymer represented by (P-1) (hereinafter, also referred to as "polymer 1"), a dispersant formed of dialkylphenyl PEO (PEO is an abbreviation for polyethylene oxide) sulfuric acid ester, and water was added to the above-described composition such that a ratio (mass of polymer 1/mass of gelatin; unit: g/g) of the mass of the polymer 1 to the total mass of the gelatin in the composition was 0.25/1. As a result, a polymer latex-containing composition was obtained. Here, in the polymer latex-containing composition, a ratio (mass of gelatin/mass of silver derived from silver halide; unit: g/g) of the mass of the gelatin to the mass of silver derived from silver halide was 0.11.

Further, EPDXY RESIN DY022 (trade name, manufactured by Nagase ChemteX Corporation) as a crosslinking agent was added. The addition amount of the crosslinking agent was adjusted such that the amount of the crosslinking agent in the silver halide-containing photosensitive layer described below was 0.09 g/m².

This way, the composition for forming a photosensitive layer was prepared.

The polymer 1 was synthesized, for example, with respect to JP3305459B and JP3754745B.

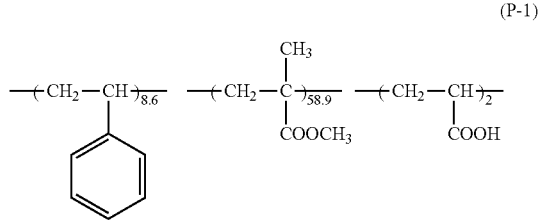

(P-1)

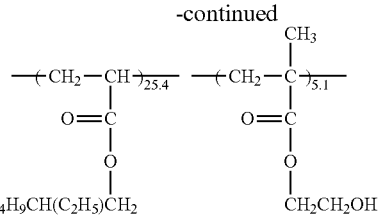

The above-described polymer latex was applied to both surfaces of a polyethylene terephthalate film (a roll-shaped elongated film, manufactured by Fujifilm Corporation) having a thickness of 100 µm prepared as the transparent film substrate, and an undercoat layer having a thickness of 0.05 µm was provided. This treatment was performed by roll-to-roll, and each of the following treatments (steps) was also performed by roll-to-roll. In this case, in the roll, the width was 1 m, and the length was 1000 m. In the polyethylene terephthalate film, the relative permittivity εr was 3.0, and the dielectric loss tangent was 0.003.

(Step H1, Step A1, Step I1)

Next, a composition for forming a silver halide non-containing layer obtained by mixing the polymer latex and gelatin, the above-described composition for forming a photosensitive layer, and a composition for forming a protective layer obtained by mixing the polymer latex and gelatin were simultaneously applied to the undercoat layer of a single surface among both of the surfaces of the polyethylene terephthalate film to form a silver halide non-containing layer, a silver halide-containing photosensitive layer, and a protective layer on the undercoat layer. A silver halide non-containing layer, a silver halide-containing photosensitive layer, and a protective layer were formed as described above on the undercoat layer of the remaining one surface.

The thickness of the silver halide non-containing layer was 2.0 the mixing mass ratio (polymer 1/gelatin) of the polymer 1 to the gelatin in the silver halide non-containing layer was 2/1, and the content of the polymer 1 was 1.3 g/m².

In addition, the thickness of the silver halide-containing photosensitive layer was 2.5 the mixing mass ratio (polymer 1/gelatin) of the polymer 1 to the gelatin in the silver halide-containing photosensitive layer was 0.25/1, and the content of the polymer 1 was 0.19 g/m².

In addition, the thickness of the protective layer was 0.15 the mixing mass ratio (polymer 1/gelatin) of the polymer 1 to the gelatin in the protective layer was 0.1/1, and the content of the polymer 1 was 0.015 g/m².

(Step B1)

The prepared photosensitive layer was patterned and exposed as follows. Light emitted from an ultrahigh pressure mercury lamp was focused by a concave mirror (dichroic mirror) formed of a dielectric multi-layer film allowing transmission of light in an infrared range, was caused to pass through a fly-eye lens, and was caused to pass through a concave mirror optical system. As a result, quasi-parallel light was obtained and used as a light source for the pattern exposure. The pattern exposure was performed by performing simultaneous contact exposure on both of the surfaces using the photosensitive material through a mask 1 and a mask 2 and repeating the intermittent transport of the photosensitive material and the simultaneous contact exposure on both the surfaces through the masks 1 and 2. In the mask 1, an antenna array pattern 31 shown in FIG. 17 including an antenna pattern 11 and a dummy pattern 17*a* was formed. In the mask 2, a ground plane pattern 16*a* shown in FIG. 18 was formed.

In addition, the antenna pattern 11, the dummy pattern 17*a*, and the ground plane pattern 16*a* were formed of the same mesh pattern, the line width of a rhombic lattice was 2.1 μm, and the pitch of the rhombic lattice was 70.7 μm. In the pattern exposure, the positions of the mask 1 and the mask 2 during the simultaneous contact exposure on both of the surfaces were adjusted such that the mesh patterns on both of the upper and lower surfaces overlapped each other at half a pitch (regular interval).

After the exposure, the obtained sample was developed with a developer described below, was further fixed using a fixing solution (trade name; N3X-R for CN16X, manufactured by Fujifilm Corporation), was rinsed with pure water at 25° C., and was dried. As a result, a sample A was obtained, in which the antenna array pattern 31 including the antenna pattern 11 and the dummy pattern 17*a* was formed on the front surface of the polyethylene terephthalate film as the transparent film substrate, and the ground plane pattern 16*a* was formed on the back surface of the polyethylene terephthalate film.

Figure 17:
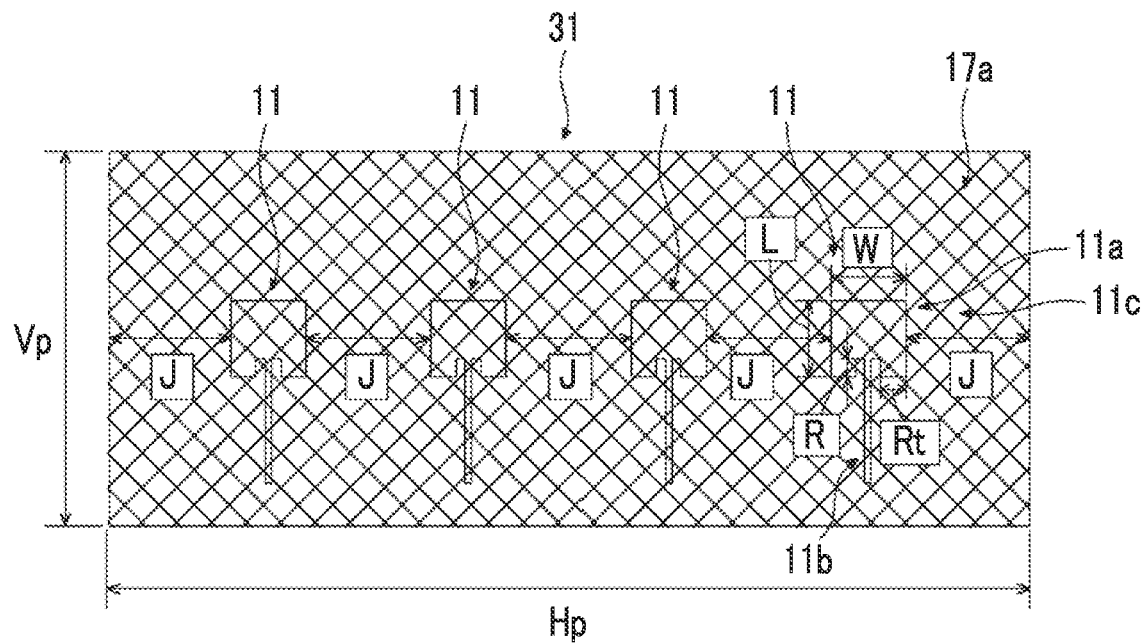
FIG. 17 is a schematic diagram showing an antenna array pattern.

The antenna array pattern 31 shown in FIG. 17 formed in the sample A was to form an antenna array. In the antenna array pattern 31, four antenna patterns 11 were disposed at intervals J. The interval J was 5 mm. The antenna pattern 11 was to form an antenna. The antenna pattern 11 includes an antenna element pattern 11*a* and a feeding line pattern 11*b*. The antenna element pattern 11*a* and the feeding line pattern 11*b* form an antenna part pattern 11*c*. In the antenna element pattern 11*a*, the length corresponding to the length W of the side of the antenna element 14 was 3 mm, the length corresponding to the length L of the side of the antenna element 14 was 3 mm, and the insertion amount R was 0.75 mm. In the feeding line pattern 11*b*, the length corresponding to the feeding line 15 was 5 mm, and the length corresponding to the width of the feeding line 15 was 0.25 mm. In addition, a length Rt of one side of a portion where the feeding line pattern 11*b* was provided was 1 mm.

The dummy pattern 17*a* was continuously provided around the antenna pattern 11 without providing the interval. The dummy pattern 17*a* was to form a dummy pattern part.

Figure 18:
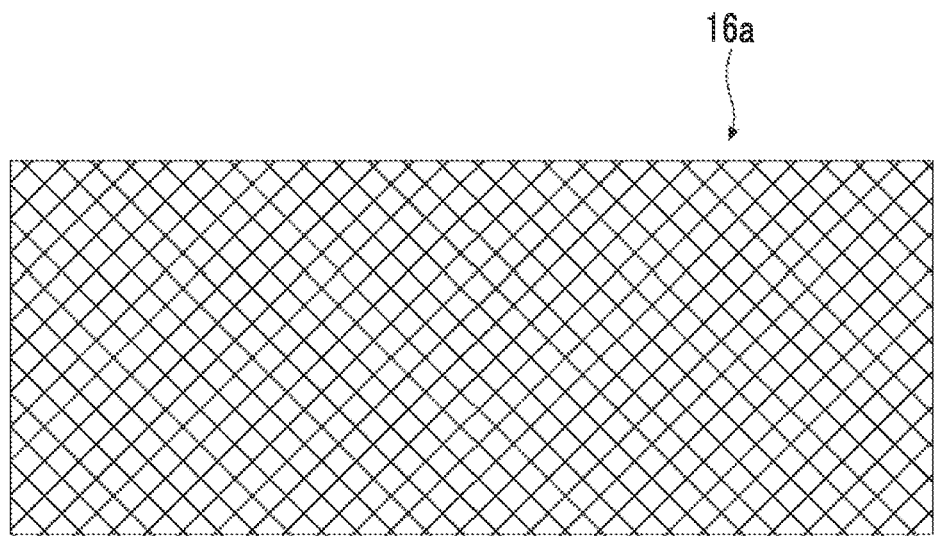
FIG. 18 is a schematic diagram showing a ground plane pattern.

The ground plane pattern 16*a* shown in FIG. 18 was formed of only the mesh pattern. The ground plane pattern 16*a* was to form the ground part.

Figure 19:
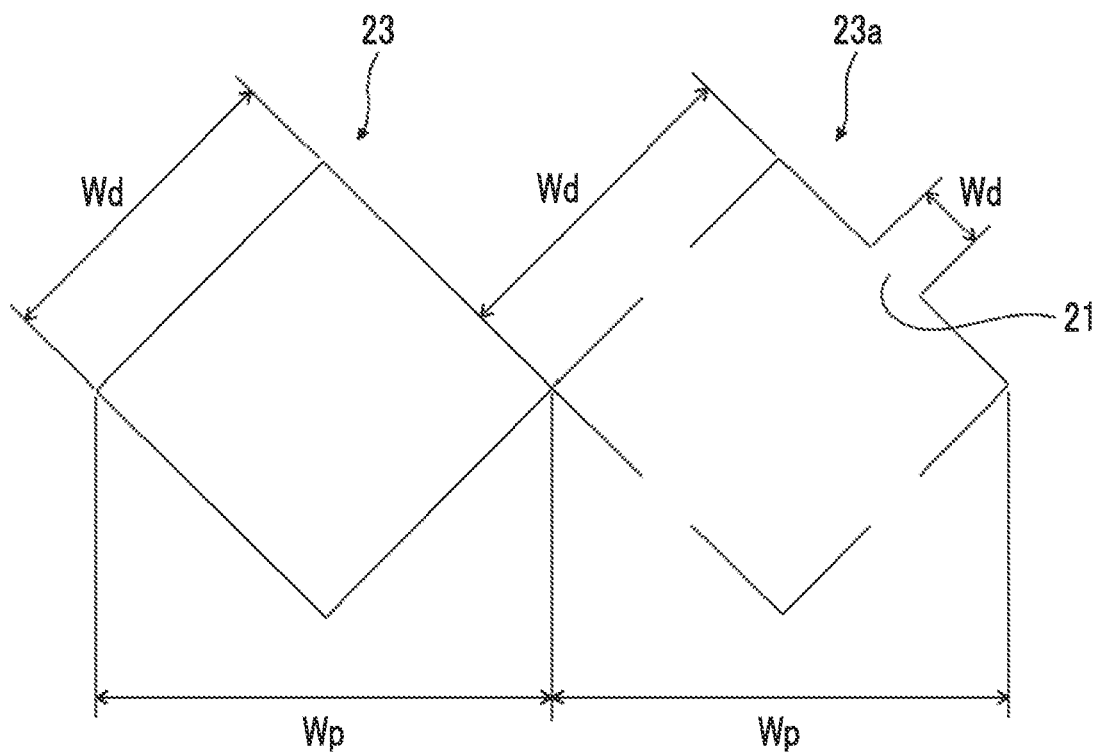
FIG. 19 is a schematic diagram showing a mesh pattern.

In addition, the mesh pattern forming the antenna pattern, the dummy pattern, and the ground plane pattern was formed of a rhombic lattice 23 (refer to FIG. 19). In the rhombic lattice 23, as described above, the length Wd of one side corresponding to the pitch was 70.7 μm, and the length Wp of a diagonal line was 100 μm. In addition, as shown in FIG. 19, in order to allow the antenna pattern 11 and the dummy pattern 17*a* to enter a non-conduction state, a disconnected portion 21 was provided on a rhombic lattice 23*a* around the antenna pattern 11. The disconnected portion 21 was provided in the middle of one side of the rhombic lattice 23*a*, and the length Wb of the disconnected portion 21 was 5 μm.

In FIGS. 17 and 18, the size of the mesh pattern is schematically shown and is different from the actual size.

In addition, both of the antenna array pattern 31 shown in FIG. 17 and the ground plane pattern 16*a* shown in FIG. 18 were rectangular patterns having a length Hp and a width Vp. The length Hp was 37 mm, and the width Vp was 15 mm.

(Composition of Developer)

1 L of the developer included the following compounds.

| | |
|---|---|
| Hydroquinone | 0.037 mol/L |
| N-methylamino phenol | 0.016 mol/L |
| Sodium metaborate | 0.140 mol/L |
| Sodium hydroxide | 0.360 mol/L |
| Sodium bromide | 0.031 mol/L |
| Potassium metabisulfite | 0.187 mol/L |

The obtained sample A was dipped in warm water at 50° C. for 180 seconds. Next, water was drained by air shower, and the sample A was naturally dried.

(Step C1)

The sample A obtained in the step B1 was transported into a superheated steam treatment bath at 110° C., was left to stand for 30 seconds, and was treated with superheated steam. In this case, the flow rate of the steam was 100 kg/h.

(Step D1)

The sample A obtained in the step C1 was dipped in a hypochlorous acid-containing aqueous solution (25° C.) for 30 seconds. The sample A was taken out from the aqueous solution, was dipped in warm water (liquid temperature: 50° C.) for 120 seconds, and was cleaned. Next, water was drained by air shower, and the sample A was naturally dried.

The hypochlorous acid-containing aqueous solution used was prepared by diluting HAITER (manufactured Kao Corporation) to two times and using the diluted solution.

(Step E1)

The sample A obtained in the step D1 was dipped in a plating liquid A (30° C.) having the following composition for 270 seconds. The sample A was taken out from the plating liquid A, was dipped in warm water (liquid temperature: 50° C.) for 120 seconds, and was cleaned.

The composition of the plating liquid A (total amount: 1200 ml) was as shown below. The pH of the plating liquid A was 9.5, and was adjusted by adding a predetermined amount of potassium carbonate (manufactured by Fujifilm Wako Pure Chemical Corporation) thereto. In addition, the following components used were products manufactured by Fujifilm Wako Pure Chemical Corporation. A change in line width before and after the plating treatment was not shown.

(Composition of Plating Liquid A)

| | |
|---|---|
| AgNO$_3$ | 8.8 g |
| Sodium sulfite | 72 g |
| Sodium thiosulfate pentahydrate | 66 g |
| Potassium iodide | 0.004 g |
| Citric acid | 12 g |
| Methylhydroquinone | 3.67 g |
| Potassium carbonate | a predetermined amount |
| Water | remainder |

(Step F1)

The sample A obtained in the step E1 was calendared at a pressure of 30 kN using a calendaring device including a combination of a metal roller and a resin roller. The calendar treatment was performed at room temperature.

(Step G1)

The sample A obtained in the step F1 was transported into a superheated steam treatment bath at 110° C., was left to stand for 30 seconds, and was treated with superheated steam. As a result, the transparent film substrate was formed, in which the antenna pattern and the dummy pattern part based on the antenna pattern 11 and the dummy pattern 17*a* were formed to form the antenna array on the front surface of the polyethylene terephthalate film as the transparent film substrate, and the ground part based on the ground plane pattern 16a was formed on the back surface of the polyethylene terephthalate film. Hereinafter, this transparent film substrate will be simply referred to as the transparent film substrate where the antenna array was formed. Regarding the size of the transparent film substrate where the antenna array was formed, the length corresponding to the length Hp of the antenna array pattern 31 was 60 mm, and the width corresponding to the width Vp of the antenna array pattern 31 was 25 mm.

In this case, the flow rate of the steam was 100 kg/h. The obtained mesh pattern region was a mesh-like layer of the rhombic lattice formed of the fine silver wire as shown in FIG. 4. The line width of the fine wire was 2.1 µm, and the thickness of the conductive fine wire was 1.5 µm.

Regarding the surface roughness Rq(A) of the fine wire, a cross-section of the fine wire in the length direction was cut into a length of about 20 µm with a microtome, and carbon was vapor-deposited on the exposed cross-section of the fine wire to impart conductivity. The cross-sectional image was acquired using a scanning electron microscope. Using the image processing software Image J, the acquired cross-sectional image was analyzed to obtain the surface roughness. The measurement range was set as 20 µm, cross-sectional images of any five positions of the fine wire were acquired to obtain surface roughness values thereof, and an arithmetic mean value corresponding to the surface roughness values of the five positions was obtained as the surface roughness Rq(A). The surface roughness Rq(A) of Example 1 was 0.08 µm.

Regarding the surface roughness Rq(B) of the fine wire, as in the above-described surface roughness Rq(A), a cross-section of the fine wire in the length direction was cut into a length of about 20 µm with a microtome, and carbon was vapor-deposited on the exposed cross-section of the fine wire to impart conductivity. The cross-sectional image was acquired using a scanning electron microscope. Using the image processing software Image J, the acquired cross-sectional image was analyzed to obtain the surface roughness. The measurement range was set as 20 µm, cross-sectional images of any five positions of the fine wire were acquired to obtain surface roughness values thereof, and an arithmetic mean value corresponding to the surface roughness values of the five positions was obtained as the surface roughness Rq(B). The surface roughness Rq(B) of Example 1 was 0.15 µm.

A cross-section of the obtained sample A was cut with a microtome, carbon was vapor-deposited on the cross-section, and the cross-section was observed with a SEM S-5200 (manufactured by Hitachi High-Technologies Corporation). As the observation mode, a reflective electron mode was used, and the acceleration voltage was 5 kV.

The proportion (vol %) of the silver particles was 70 vol % based on the observation image of the vertical section of the fine wire obtained by the scanning electron microscope.

Examples 2 to 17 and Comparative Examples 1 to 3

In Examples 2 to 17 and Comparative Examples 1 to 3, the exposure amount was changed by adjusting the exposure time in the step B1, and the line width was adjusted.

"Line Width of Fine Wire" and "Thickness of Fine Wire" shown in Table 1 were measured after the heated water vapor treatment in the step G1, and a SEM S-5200 (manufactured by Hitachi High-Technologies Corporation) was used for the measurement of the line width of the fine wire and the thickness of the fine wire. In the measurement of the line width and the thickness of the fine wire, a cross-section of the fine wire was cut with a microtome, and carbon was vapor-deposited on the exposed cross-section. Any five positions of one fine wire were selected, vertical sections thereof were observed with a scanning electron microscope, and an arithmetic mean value corresponding to the line widths obtained from the images was obtained as the line width. As in the line width, the thickness of the fine wire was obtained as an arithmetic mean value of a portion corresponding to the thicknesses of five positions of one fine wire.

In addition, the particle diameter of the silver particles was adjusted by adjusting the exposure amount in the heated water vapor treatment of the step G1.

By increasing the plating treatment time of the step E1, particles of the outer side grew, and the vol % of the silver particles was increased. Therefore, by adjusting the exposure amount and the plating treatment time in the step B1, the line width of the fine wire, the thickness of the fine wire, and the volume fraction of the silver particles were adjusted.

In addition, in Examples 2 to 17 and Comparative Examples 1 to 4, the surface roughness Rq(A) and the surface roughness Rq(B) were adjusted by adjusting the combination of the rollers used in the calendar treatment in the step F1, the material of the co-conveying mat, whether or not the co-conveying mat was provided, the pressure, the temperature, and the like.

In Comparative Example 3, electroless copper plating was performed during the plating treatment of the step E1. As the electroless copper plating solution, a commercially available electroless copper plating solution can be used. In the preparation of Comparative Example 3, "OIC ACCELERATOR" and "OIC COPPER" (manufactured by Okuno Chemical Industries Co., Ltd.) were used. The sample was dipped in OIC ACCELERATOR (25° C.) for 3 minutes and in OIC COPPER (55° C.) for 10 minutes and was rinsed with pure water at 25° C. The other steps were performed as in the other examples.

<Evaluation>

Hereinafter, the transmission loss, the transmissive visibility, and the reflective visibility as the evaluation items will be described.

(Transmission Loss)

The transmission loss was evaluated using insertion loss. Evaluation standards for the transmission loss by the insertion loss are as follows. Among 1 to 5 below, 3 or more is preferable, 4 or more is more preferable, and 5 is still more preferable.

The insertion loss refers to the decibel (dB) representing the loss of power propagating from one terminal to another terminal in a high frequency circuit formed of a two-terminal-pair network.

Figure 20:
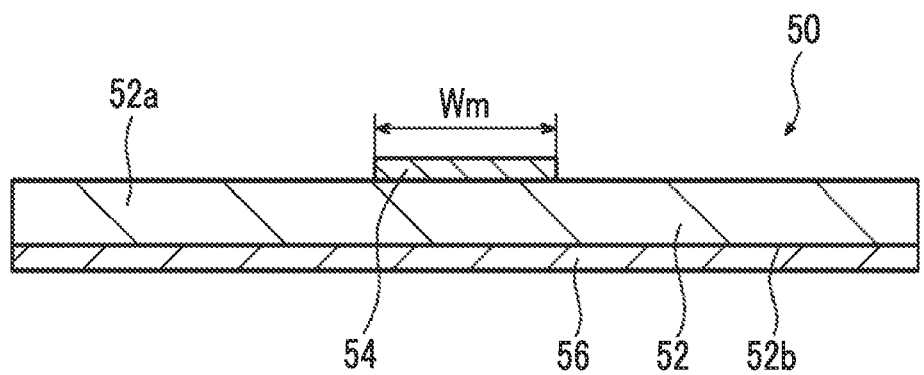
FIG. 20 is a schematic cross-sectional view showing a configuration used for evaluation of transmission loss.
Figure 21:
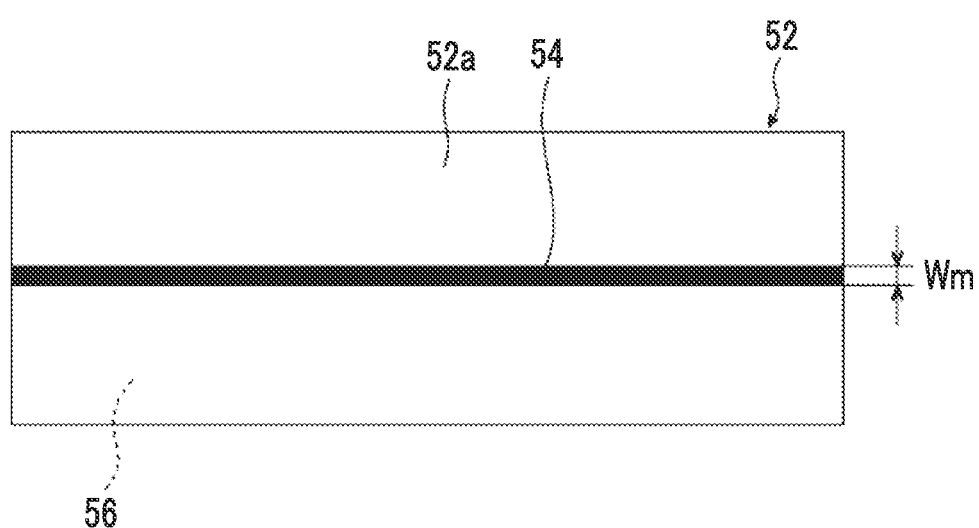
FIG. 21 is a schematic plan view showing the configuration used for the evaluation of transmission loss.

Regarding the transmission loss, a transmission loss measurement sample shown in FIGS. 20 and 21 was prepared.

In a transmission loss measurement sample 50 shown in FIG. 20, a microstrip transmission line 54 having a width Wm (hereinafter, simply referred to as "transmission line 54") was formed on a front surface 52a of a transparent film substrate 52. The transmission line 54 was linearly disposed as shown in FIG. 21. In the transmission line 54, the width Wm was 250 µm, and the length was 40 mm. A ground part 56 was formed on the entire back surface 52b. Both of the mesh patterns of the fine wires forming the transmission line 54 and the ground part 56 were the mesh patterns having the rhombic lattice 23 shown in FIG. 19. In the rhombic lattice 23, as described above, the length Wd of one side corresponding to the pitch was 70.7 µm, and the length Wp of a diagonal line was 100 µm. The transmission line 54 has 2.5 rhombic lattices in the width direction. In both of end parts of the transmission line 54, a touch land of which the entire surface was formed of metal was provided for contact with a terminal. In the touch land, the width was 250 µm, and the length was 2 mm. The width of the touch land was the same as the width Wm of the transmission line 54.

The transmission loss measurement sample 50 (refer to FIG. 20) was set in a universal test fixture (Model No. 3680V, manufactured by Anritsu Corporation), and the insertion loss (dB/cmm) at 28 GHz was obtained using a vector network analyzer (Keysight N5247A). The impedance at 28 GHz being 50Ω was verified using a smith chart of S11 of an S parameter.

5: Insertion loss<0.5 dB
4: 0.5 dB≤Insertion Loss<0.8 dB
3: 0.8 dB≤Insertion Loss<1.2 dB
2: 1.2 dB≤Insertion Loss<1.5 dB
1: 1.5 dB≤Insertion loss (Transmissive Visibility)

Regarding the transmissive visibility, in the antenna pattern part, the total light transmittance of the transparent film substrate before the formation of the mesh pattern and the total light transmittance of the transparent film substrate after the formation of the mesh pattern were measured. The opening ratio (%) was obtained as follows. The evaluation was performed using the opening ratio. Evaluation standards of the transmissive visibility by the opening ratio are as follows. Among 1 to 5 below, 3 or more is preferable, 4 or more is more preferable, and 5 is still more preferable.

Regarding the opening ratio, first, the total light transmittance of the transparent film substrate after the formation of the mesh pattern was measured. Next, for the antenna, the total light transmittance of the transparent film substrate after the formation of the mesh pattern was measured in five regions. The five regions of the transparent film substrate may have the same size or different sizes as long as the acquisition positions in the transparent film substrate are different from each other. Next, the opening ratio was acquired using the following expression. The average value of the acquired five opening ratios was the opening ratio.

Opening Ratio=((Total Light Transmittance of Transparent Film Substrate after Formation of Mesh Pattern)/(Total Light Transmittance of Transparent Film Substrate before Formation of Mesh Pattern))×100(%)

For the measurement of the total light transmittance, a spectrophotometer CM-3600A (manufactured by Konica Minolta Inc.) was used.

5: Opening Ratio≥85%
4: 80%≤Opening Ratio<85%
3: 75%≤Opening Ratio<80%
2: 70%≤Opening Ratio<75%
1: Opening Ratio<70%

(Reflective Visibility)

The transparent film substrate where the antenna array was formed was laminated in the order of a glass plate/the transparent film substrate where the antenna array was formed/the polyethylene terephthalate film. As a result, a laminate was obtained. The polyethylene terephthalate film was used for the above-described transparent film substrate, and the thickness was 100 µm. In the laminate, the transparent film substrate where the antenna array was formed was disposed such that the surface where the antenna was formed was positioned on the glass plate side. In the glass and the polyethylene terephthalate film, the length corresponding to the length Hp of the antenna array pattern 31 shown in FIG. 17 was 60 mm, and the width corresponding to the width Vp of the antenna array pattern 31 was 25 mm. In addition, in the transparent film substrate where the antenna array was formed, the length was 60 mm and the width was 25 mm as in the glass and the polyethylene terephthalate film.

Next, the laminate was vertically provided, a light emitting diode (LED) light having an illuminance of 2000 lux was emitted from an upper oblique angle of 30° to 60° with respect to the glass surface, and the transparent film substrate where the antenna array was formed was observed by visual inspection by 10 observers from a lower oblique angle of 60° to 30° with respect to the glass surface. The reflective visibility was evaluated based on the following evaluation standards. Regarding the evaluation of the reflective visibility, among 1 to 5 below, 3 or more is preferable, 4 or more is more preferable, and 5 is still more preferable. In the evaluation of the reflective visibility, the mesh patterns forming the antenna and the ground part were not recognized.

5: in a case where the transparent film substrate where the antenna array was formed was observed from a position at a distance of 15 cm, the contour of the mesh-formed portion was not recognized 4: in a case where the transparent film substrate where the antenna array was formed was observed from a position at a distance of 30 cm, the number of observers who recognized the contour of the mesh-formed portion was 0 or 1

3: in a case where the transparent film substrate where the antenna array was formed was observed from a position at a distance of 30 cm, the number of observers who recognized the contour of the mesh-formed portion was 2 to 4

2: in a case where the transparent film substrate where the antenna array was formed was observed from a position at a distance of 30 cm, the number of observers who recognized the contour of the mesh-formed portion was 5 or more 1: in a case where the transparent film substrate where the antenna array was formed was observed from a position at a distance of 50 cm, the number of observers who recognized the contour of the mesh-formed portion was 5 or more

TABLE 1

|  | Metal forming Fine Wire | Thickness of Transparent Film Substrate (µm) | Line Width of Fine Wire (µm) | Thickness of Fine Wire (µm) | Volume Fraction (%) | Rq(A) (µm) | Rq(B) (µm) | [Rq(A) − Rq(B)] (µm) | Evaluation | | |
|---|---|---|---|---|---|---|---|---|---|---|---|
|  |  |  |  |  |  |  |  |  | Transmission Loss | Transmissive Visibility | Reflective Visibility |
| Example 1 | Ag | 100 | 2.1 | 1.5 | 70 | 0.08 | 0.15 | 0.07 | 5 | 5 | 5 |
| Example 2 | Ag | 100 | 1.0 | 0.5 | 70 | 0.08 | 0.13 | 0.05 | 3 | 5 | 5 |
| Example 3 | Ag | 100 | 2.0 | 1.5 | 70 | 0.08 | 0.15 | 0.07 | 4 | 5 | 5 |

TABLE 1-continued

| | Metal forming Fine Wire | Thickness of Transparent Film Substrate (μm) | Line Width of Fine Wire (μm) | Thickness of Fine Wire (μm) | Volume Fraction (%) | Rq(A) (μm) | Rq(B) (μm) | [Rq(A) − Rq(B)] (μm) | Evaluation | | |
|---|---|---|---|---|---|---|---|---|---|---|---|
| | | | | | | | | | Transmission Loss | Transmissive Visibility | Reflective Visibility |
| Example 4 | Ag | 100 | 3.0 | 2.0 | 70 | 0.10 | 0.16 | 0.06 | 5 | 4 | 4 |
| Example 5 | Ag | 100 | 3.7 | 2.0 | 70 | 0.09 | 0.15 | 0.06 | 5 | 4 | 4 |
| Example 6 | Ag | 100 | 3.8 | 2.0 | 70 | 0.07 | 0.14 | 0.07 | 5 | 3 | 3 |
| Example 7 | Ag | 100 | 4.9 | 2.0 | 70 | 0.08 | 0.16 | 0.08 | 5 | 3 | 3 |
| Example 8 | Ag | 100 | 4.9 | 4.0 | 70 | 0.08 | 0.15 | 0.07 | 5 | 3 | 3 |
| Example 9 | Ag | 100 | 1.0 | 0.5 | 90 | 0.08 | 0.09 | 0.01 | 4 | 5 | 5 |
| Example 10 | Ag | 100 | 2.1 | 1.5 | 60 | 0.08 | 0.15 | 0.07 | 3 | 5 | 5 |
| Example 11 | Ag | 100 | 2.1 | 1.5 | 70 | 0.05 | 0.10 | 0.05 | 5 | 5 | 4 |
| Example 12 | Ag | 100 | 2.1 | 1.5 | 70 | 0.40 | 0.17 | 0.23 | 3 | 5 | 4 |
| Example 13 | Ag | 100 | 2.1 | 1.5 | 70 | 0.30 | 0.17 | 0.05 | 4 | 5 | 5 |
| Example 14 | Ag | 100 | 2.1 | 1.5 | 70 | 0.04 | 0.10 | 0.06 | 5 | 5 | 3 |
| Example 15 | Ag | 100 | 2.1 | 1.5 | 70 | 0.05 | 0.35 | 0.30 | 4 | 5 | 3 |
| Example 16 | Ag | 30 | 2.0 | 1.5 | 70 | 0.08 | 0.15 | 0.07 | 3 | 3 | 4 |
| Example 17 | Ag | 300 | 2.0 | 1.5 | 70 | 0.08 | 0.15 | 0.07 | 5 | 5 | 5 |
| Comparative Example 1 | Ag | 100 | 0.9 | 0.5 | 70 | 0.08 | 0.09 | 0.01 | 2 | 5 | 5 |
| Comparative Example 2 | Ag | 100 | 5.0 | 2.0 | 70 | 0.10 | 0.15 | 0.05 | 5 | 2 | 2 |
| Comparative Example 3 | Cu | 100 | 3.0 | 2.0 | 70 | 0.05 | 0.10 | 0.05 | 5 | 4 | 1 |

As shown in Table 1, in Examples 1 to 17, low transmission loss and visibility were simultaneously achieved as compared to Comparative Examples 1 to 3. It was verified that all of the antennas according to Examples 1 to 17 functioned as millimeter band antennas.

In Comparative Example 1, the line width of the fine wire was small, the transmission loss was high, and low transmission loss and visibility were not able to be simultaneously achieved.

In Comparative Example 2, the line width of the fine wire was large, the transmissive visibility and the reflective visibility were poor, and low transmission loss and visibility were not able to be simultaneously achieved.

In Comparative Example 3, the fine copper wire was used, the reflective visibility was poor, and low transmission loss and reflective visibility were not able to be simultaneously achieved.

It was found from Examples 1 and 10 and Examples 2 and 9 that, in a case where the proportion of the silver particles was high, the transmission loss was low. It was found from Examples 12 to 15 that, in a case where the surface roughness Rq(A) was in the preferable range, the transmission loss was low or the reflective visibility was excellent. Even in a case where the surface roughness Rq(A) of the visible side surface was large as in Example 13, as long as the surface roughness Rq(A) and |Rq(B)−Rq(A)| were in the preferable range, the reflective visibility was also excellent.

In addition, it was found from Examples 3, 16, and 17 that, in a case where the transparent film substrate was thick, the transmission loss decreased, and in a case where the transparent film substrate was thin, the transmission loss tended to increase.

EXPLANATION OF REFERENCES

10, 10a, 10b, 10c, 10d: antenna
11: antenna pattern
11a: antenna element pattern
11b: feeding line pattern
11c: antenna part pattern
12, 52: transparent film substrate
12a: front surface
12b: back surface
13: antenna part
14: antenna element
15: feeding line
16: ground part
16a: ground plane pattern
17: dummy pattern part
17a: dummy pattern
20: fine wire
20a: surface
20d: surface
21: disconnected portion
22: opening portion
23, 23a: rhombic lattice
24: polymer
26: silver particle
30, 30a, 30b, 30c: antenna array
31: antenna array pattern
32: antenna element
33: notched portion
34, 35: fine wire
40a: first calendar roller
40b: second calendar roller
42: co-conveying mat
50: transmission loss measurement sample
52a: front surface
52b: back surface
54: microstrip transmission line (transmission line)
56: ground part
J, Gt: interval
L, $L_1$, $L_2$, Rt: length
Hp: length
R: insertion amount
Vp: width
W, $W_1$, $W_2$, Wb, Wp: length
Wd: length of one side
Ws: line width
h: thickness
t: thickness

What is claimed is:

1. An antenna comprising:
a transparent film substrate;
an antenna element that is provided on one surface among two surfaces of the transparent film substrate; and
a ground part that is provided on the other surface among the two surfaces of the transparent film substrate,
wherein the antenna element and the ground part are formed of a mesh pattern formed of a fine silver wire,
a line width of the fine silver wire is 1.0 μm or more and less than 5.0 μm,
a thickness of the transparent film substrate is 30 μm or more and 300 μm or less,
a feeding line is provided on the one surface of the transparent film substrate,
the feeding line is formed of the mesh pattern formed of the fine silver wire,
the line width of the fine silver wire is 2.1 μm or more and 3.7 μm or less, and
in a case where the transparent film substrate is observed from the one surface or the other surface, a surface roughness of the fine silver wire of the one surface or the other surface on an observation side is represented by Rq(A), and a surface roughness of the fine silver wire of the other surface or the one surface on a transparent film substrate side opposite to the observation side is represented by Rq(B),
0.05 μm≤Rq(A)≤0.35 μm and |Rq(B)−Rq(A)|≤0.25 μm are satisfied.

2. An antenna comprising:
a transparent film substrate;
an antenna element that is provided on one surface among two surfaces of the transparent film substrate; and
a ground part that is provided on the other surface among the two surfaces of the transparent film substrate,
wherein the antenna element and the ground part are formed of a mesh pattern formed of a fine silver wire,
a line width of the fine silver wire is 1.0 μm or more and less than 5.0 μm,
a thickness of the transparent film substrate is 30 μm or more and 300 μm or less,
a feeding line is provided on the one surface of the transparent film substrate,
the feeding line is formed of the mesh pattern formed of the fine silver wire,
the fine silver wire includes a plurality of silver particles dispersed in a polymer,
a proportion of the plurality of silver particles in the fine silver wire is 70 vol % or more, and
in a case where the transparent film substrate is observed from the one surface or the other surface, a surface roughness of the fine silver wire of the one surface or the other surface on an observation side is represented by Rq(A), and a surface roughness of the fine silver wire of the other surface or the one surface on a transparent film substrate side opposite to the observation side is represented by Rq(B),
0.05 μm≤Rq(A)≤0.35 μm and |Rq(B)−Rq(A)|≤0.25 μm are satisfied.

3. An antenna comprising:
a transparent film substrate;
an antenna element that is provided on one surface among two surfaces of the transparent film substrate; and
a ground part that is provided on the other surface among the two surfaces of the transparent film substrate,
wherein the antenna element and the ground part are formed of a mesh pattern formed of a fine silver wire,
a line width of the fine silver wire is 1.0 μm or more and less than 5.0 μm,
a thickness of the transparent film substrate is 30 μm or more and 300 μm or less,
a feeding line is provided on the one surface of the transparent film substrate,
the feeding line is formed of the mesh pattern formed of the fine silver wire,
a thickness of the fine silver wire is 0.5 μm or more and less than 5.0 μm, and
in a case where the transparent film substrate is observed from the one surface or the other surface, a surface roughness of the fine silver wire of the one surface or the other surface on an observation side is represented by Rq(A), and a surface roughness of the fine silver wire of the other surface or the one surface on a transparent film substrate side opposite to the observation side is represented by Rq(B),
0.05 μm≤Rq(A)≤0.35 μm and |Rq(B)−Rq(A)|≤0.25 μm are satisfied.

4. The antenna according to claim 1,
wherein the fine silver wire includes a plurality of silver particles dispersed in a polymer, and
a proportion of the plurality of silver particles in the fine silver wire is 70 vol % or more.

5. The antenna according to claim 1,
wherein a thickness of the fine silver wire is 0.5 μm or more and less than 5.0 μm.

6. The antenna according to claim 2,
wherein a thickness of the fine silver wire is 0.5 μm or more and less than 5.0 μm.

7. The antenna according to claim 4,
wherein a thickness of the fine silver wire is 0.5 μm or more and less than 5.0 μm.

* * * * *